(12) United States Patent
Akashi

(10) Patent No.: US 6,732,340 B1
(45) Date of Patent: May 4, 2004

(54) METHOD FOR DESIGNING A SEMICONDUCTOR INTEGRATED CIRCUIT WHICH INCLUDES CONSIDERATION OF PARASITIC ELEMENTS ON CRITICAL DATA PATHS

(75) Inventor: Teruo Akashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 09/620,219

(22) Filed: Jul. 20, 2000

(30) Foreign Application Priority Data

Jul. 26, 1999 (JP) .......................................... 11-210165

(51) Int. Cl.[7] ............................. G06F 17/50; G06F 9/45
(52) U.S. Cl. ....................... 716/5; 716/4; 716/6; 716/7; 716/8
(58) Field of Search ................................ 716/5, 6, 4, 7, 716/8

(56) References Cited

U.S. PATENT DOCUMENTS

| | | | | |
|---|---|---|---|---|
| 5,381,345 A | * | 1/1995 | Takegami et al. | 703/19 |
| 5,461,576 A | * | 10/1995 | Tsay et al. | 716/6 |
| 5,666,290 A | * | 9/1997 | Li et al. | 716/8 |
| 5,699,264 A | | 12/1997 | Nakamura et al. | 716/6 |
| 5,706,206 A | * | 1/1998 | Hammer et al. | 716/4 |
| 5,838,947 A | * | 11/1998 | Sarin | 703/14 |
| 5,901,063 A | * | 5/1999 | Chang et al. | 716/4 |
| 6,099,581 A | * | 8/2000 | Sakai | 716/11 |
| 6,182,269 B1 | * | 1/2001 | Laubhan | 716/5 |
| 6,212,490 B1 | * | 4/2001 | Li et al. | 703/14 |
| 6,243,653 B1 | * | 6/2001 | Findley | 702/65 |
| 6,363,516 B1 | * | 3/2002 | Cano et al. | 716/5 |
| 6,421,814 B1 | * | 7/2002 | Ho | 716/5 |

FOREIGN PATENT DOCUMENTS

| | | |
|---|---|---|
| JP | 9-6824 | 1/1997 |
| JP | 11-40677 | 2/1999 |
| JP | 11-154168 | 6/1999 |

OTHER PUBLICATIONS

H. Youssef et al., Critical Path Issue in VLSI Designs, 1989 International Conference on Computer–Aided Design, pp. 520–523, Nov. 1989.*
Marazzini et al., CIRCE: A Program for Parasitic Parameter Extraction, Proceedings of the European Design automation Conference, pp. 387–390, Mar., 1990.*
Guruswamy et al., Cellerity: A Fully Automatic Layout Synthesis System for Standard Cell Libraries, Proceedings of the 34th Annual Conference on Design Automation, pp. 327–332, Mar. 1997.*
Chao et al., An Extraction Method to Determine Interconnect Parsitic Parameters, IEEE Transactions on Semiconductor Manufacturing, oages 615–623, Nov. 1998.*

* cited by examiner

*Primary Examiner*—A. M. Thompson
(74) *Attorney, Agent, or Firm*—McDermott, Will & Emery

(57) ABSTRACT

In a layout data forming step and a layout outputting step after a netlist is read, layout data is formed based on the netlist. In a path sorting step in parallel with these steps, a delay for each path is calculated based on the netlist to compare with a predetermined delay. Only a path having a delay exceeding the predetermined delay is output as a target path to an extraction path file. Then in a parasitic element extracting step, parasitic elements are extracted only from a graphic pattern included in the target path in the layout data while referencing the extraction path file.

9 Claims, 28 Drawing Sheets

Fig. 3

| PATH1 | 18A, 20A, 22A, 23A |
| --- | --- |
| PATH2 | 25A, 27A, 29A, 31A, 32A, 22A, 23A |
| PATH3 | 25A, 27A, 29A, 31A, 34A |
| PATH4 | 25A, 27A, 29A, 31A, 36A |
| PATH5 | 37A, 29A, 31A, 32A, 22A, 23A |
| PATH6 | 37A, 29A, 31A, 34A |
| PATH7 | 37A, 29A, 31A, 36A |

Fig. 5

| PATH2 | 25A, 27A, 29A, 31A, 32A, 22A, 23A |

| PATH1 | 18A, 20A, 22A, 23A |
|---|---|

Fig. 13

| (0001) | 18B-25B | : | S=1, L=5 |
| --- | --- | --- | --- |
| (0002) | 25B-37B | : | S=2, L=6 |
| (0003) | 27B-37B | : | S=1, L=3 |
| (0004) | 29B-31B | : | S=4, L=13 |
| (0005) | 31B-23B | : | S=2, L=4 |
| (0006) | 31B-37B | : | S=4, L=14 |
| (0007) | 31B-34B | : | S=4, L=10 |
| (0008) | 32B-20B | : | S=1, L=3 |
| (0009) | 22B-23B | : | S=4, L=10 |
| (0010) | 23B-34B | : | S=1, L=25 |
| (0011) | 34B-36B | : | S=4, L=10 |

Fig. 14

| | |
|---|---|
| PATH1 | 18A, 20A, 22A, 23A |
| PATH2 | 25A, 27A, 29A, 31A, 32A, 22A, 23A |
| PATH3 | 25A, 27A, 29A, 31A, 34A |
| PATH5 | 37A, 29A, 31A, 32A, 22A, 23A |
| PATH6 | 37A, 29A, 31A, 36A |

Fig. 17

| PATH2 | 25A, 27A, 29A, 31A, 32A, 22A, 23A |
| --- | --- |
| PATH1 | 18A, 20A, 22A, 23A |

Fig. 21

| PATH1 | 1.2 |
| PATH2 | 2.4 |
| PATH3 | 1.5 |
| PATH4 | 1.4 |
| PATH5 | 1.9 |
| PATH6 | 1.0 |
| PATH7 | 1.2 |

Fig. 25

| PATH2 | 25A, 27A, 29A, 31A, 32A, 22A, 23A |

Fig. 26

| PATH1 — PATH3 |
| PATH1 — PATH6 |
| PATH2 — PATH3 |
| PATH2 — PATH6 |
| PATH3 — PATH5 |
| PATH5 — PATH6 |

METHOD FOR DESIGNING A SEMICONDUCTOR INTEGRATED CIRCUIT WHICH INCLUDES CONSIDERATION OF PARASITIC ELEMENTS ON CRITICAL DATA PATHS

BACKGROUND OF THE INVENTION

The present invention relates to a method for designing a semiconductor integrated circuit with parasitic elements extracted from layout data to analyze the operation timing of circuit elements.

As the design rule for a semiconductor integrated circuit fabrication process has been reduced year after year, it has become increasingly important to analyze the operation timing of circuit elements, included in the circuit being designed, even more accurately by extracting various parasitic elements therefrom. This is because the operation speed of the circuit will be affected even more seriously by those parasitic elements like wire resistance and capacitance components. Thus, in the timing simulation, it should be estimated as accurately as possible how much delay will be caused by the parasitic elements that are unavoidably added to every interconnection line.

In a known semiconductor integrated circuit design process, the parasitic elements should be extracted one by one from given layout data for all graphics patterns. That is to say, the wire resistance and capacitance components should be estimated for every single graphics pattern.

According to such a one-by-one extraction technique, however, it takes an enormous amount of time to process a huge number of graphics patterns for a large-scale integrated circuit. Thus, the required processing time will increase almost exponentially as the integrated circuit to be designed is scaled up.

SUMMARY OF THE INVENTION

It is therefore an object of the present invention to extract those parasitic elements in a much shorter time for improving the efficiency of the timing simulation.

The present inventors found that some of the paths, interconnecting multiple elements together in a circuit being designed, do not have to be extracted as paths with parasitic elements, because the timing constraints imposed on those paths are not so tight. Thus, to achieve the above object, we extract no paths other than those indispensable for the timing simulation with that finding in mind.

Specifically, a first inventive method is adapted to design a semiconductor integrated circuit, including multiple circuit elements and multiple paths interconnecting those elements together, by extracting parasitic elements, associated with at least one of the paths, from the circuit to analyze operation timing of the circuit elements. The method includes the steps of: a) sorting out at least one of the paths, which is expected to cause a delay exceeding a predetermined amount of time, as a target path according to a netlist describing topology information about interconnections among the circuit elements; b) forming graphics patterns -for the respective circuit elements and laying out the graphics patterns according to the netlist, thereby generating layout data; and c) extracting the parasitic elements from at least one of the graphics patterns, which correspond to the target path, in accordance with the layout data.

According to the first method, at least one of the paths, which is expected to cause a delay exceeding a predetermined amount of time, is sorted out as a target path according to a netlist describing topology information about interconnections among the circuit elements. Then, parasitic elements are extracted from at least one of the graphics patterns, corresponding to the target path, in accordance with the layout data generated from the netlist. That is to say, according to the present invention, there is no need to extract the parasitic elements from all the paths anymore. As a result, the parasitic elements can be extracted much more efficiently and rapidly, thus meeting the demand for accurate and quick simulation on the operation timing of the circuit elements.

A second inventive method is also adapted to design a semiconductor integrated circuit, including multiple circuit elements and multiple paths interconnecting those elements together, by extracting parasitic elements, associated with at least one of the paths, from the circuit to analyze operation timing of the circuit elements. The method includes the steps of: a) forming graphics patterns for the respective circuit elements and laying out the graphics patterns according to a netlist describing topology information about interconnections among the circuit elements, thereby generating layout data including information about wire lengths; b) estimating wire lengths of interconnection lines included in each of the paths in accordance with the layout data and sorting out at least one of the paths, in which at least one of the wire lengths estimated exceeds a predetermined length, as a target path; and c) extracting the parasitic elements from at least one of the graphics patterns, which correspond to the target path, in accordance with the layout data.

According to the second method, the wire lengths of interconnection lines included in each of the paths are estimated in accordance with the layout data obtained from the netlist. Next, at least one of the paths, in which at least one of the wire lengths estimated exceeds a predetermined length, is sorted out as a target path. Then, parasitic elements are extracted from at least one of the graphics patterns, corresponding to the target path, in accordance with the layout data. Thus, according to the present invention, there is no need to extract the parasitic elements from all the paths anymore. As a result, the parasitic elements can be extracted much more efficiently and rapidly, thus meeting the demand for accurate and quick simulation on the operation timing of the circuit elements.

A third inventive method is also adapted to design a semiconductor integrated circuit, including multiple circuit elements and multiple paths interconnecting those elements together, by extracting parasitic elements, associated with at least one of the paths, from the circuit to analyze operation timing of the circuit elements. The method includes the steps of: a) forming graphics patterns for the respective circuit elements and laying out the graphics patterns according to a netlist describing topology information about interconnections among the circuit elements, thereby generating layout data including information about wire lengths; b) estimating the length of at least one pair of interconnection lines, which are included in two adjacent ones of the paths and are substantially parallel to each other, in accordance with the layout data and sorting out at least two of the paths, in which the estimated length of the parallel interconnection lines exceeds a predetermined length, as target paths; and c) extracting the parasitic elements from at least one of the graphics patterns, which correspond to the target paths, in accordance with the layout data.

According to the third method, the length of at least one pair of interconnection lines, which are included in two adjacent ones of the paths and are substantially parallel to each other, is estimated in accordance with the layout data obtained from the netlist. Next, at least two of the paths, in which the estimated length of the parallel interconnection lines exceeds a predetermined length, are sorted out as target paths. Then, parasitic elements are extracted from at least one of the graphics patterns, corresponding to the target paths, in accordance with the layout data. Thus, according to the present invention, there is no need to extract the parasitic elements from all the paths anymore. As a result, the parasitic elements can be extracted much more efficiently and rapidly, thus meeting the demand for accurate and quick simulation on the operation timing of the circuit elements.

In one embodiment of the second or third method of the present invention, the step b) preferably includes the step of sorting out at least one of the paths, which is expected to cause a delay-exceeding a predetermined amount of time, as the target path in accordance with the layout data. Generally speaking, a path might cause a delay exceeding a predetermined amount of time even though the total wire length of interconnection lines, included in the path, is less than the predetermined length. According to this embodiment, however, such a path can also be sorted out, thus improving the accuracy of the timing simulation.

A fourth inventive method is also adapted to design a semiconductor integrated circuit, including multiple circuit elements and multiple paths interconnecting those elements together, by extracting parasitic elements, associated with at least one of the paths, from the circuit to analyze operation timing of the circuit elements. The method includes the steps of: a) estimating delays, which will be caused by the respective paths, according to a netlist describing topology information about interconnections among the circuit elements; b) forming graphics patterns for the respective circuit elements and laying out the graphics patterns according to the netlist, thereby generating layout data; c) sorting out at least one of the paths, of which the estimated delay exceeds a predetermined amount of time, as a target path; or c') estimating wire lengths of interconnection lines included in each of the paths in accordance with the layout data and sorting out at least one of the paths, in which at least one of the wire lengths estimated exceeds a predetermined length, as the target path; and d) extracting the parasitic elements from at least one of the graphics patterns, which correspond to the target path, in accordance with the layout data.

According to the fourth method, at least one of the paths, of which the estimated delay exceeds a predetermined amount of time, is sorted out as the target path. Or the wire length of interconnection lines, included in each of the paths, are estimated in accordance with the layout data and at least one of the paths, in which at least one of the wire lengths estimated exceeds a predetermined length, is sorted out as the target path. Then, parasitic elements are extracted from at least one of the graphics patterns, corresponding to the target path, in accordance with the layout data. Thus, according to the present invention, there is no need to extract the parasitic elements from all the paths anymore. As a result, the parasitic elements can be extracted much more efficiently and rapidly, thus meeting the demand for accurate and quick simulation on the operation timing of the circuit elements.

A fifth inventive method is also adapted to design a semiconductor integrated circuit, including multiple circuit elements and multiple paths interconnecting those elements together, by extracting parasitic elements, associated with at least one of the paths, from the circuit to analyze operation timing of the circuit elements. The method includes the steps of: a) estimating delays, which will be caused by the respective paths, according to a netlist describing topology information about interconnections among the circuit elements; b) forming graphics patterns for the respective circuit elements and laying out the graphics patterns according to the netlist, thereby generating layout data; c) sorting out at least one of the paths, of which the estimated delay exceeds a predetermined amount of time, as a target path; or c') estimating the length of at least one pair of interconnection lines, which are included in two adjacent ones of the paths and are substantially parallel to each other, in accordance with the layout data and sorting out at least two of the paths, in which the estimated length of the parallel interconnection lines exceeds a predetermined length, as the target paths; and d) extracting the parasitic elements from at least one of the graphics patterns, which correspond to the target path, in accordance with the layout data.

According to the fifth method, at least one of the paths, of which the estimated delay exceeds a predetermined amount of time, is sorted out as a target path. Or the length of at least one pair of interconnection lines, which are included in two adjacent ones of the paths and are substantially parallel to each other, is estimated in accordance with the layout data and at least two of the paths, in which the estimated length of the parallel interconnection lines exceeds a predetermined length, are sorted out as the target paths. Then, parasitic elements are extracted from at least one of the graphics patterns, corresponding to the target paths, in accordance with the layout data. Thus, according to the present invention, there is no need to extract the parasitic elements from all the paths anymore. As a result, the parasitic elements can be extracted much more efficiently and rapidly, thus meeting the demand for accurate and quick simulation on the operation timing of the circuit elements.

In one embodiment of the present invention, the step c') preferably includes the step of sorting out the least two paths, in which the estimated length of the parallel interconnection lines exceeds the predetermined length, as paths to be analyzed for crosstalk. And the step d) preferably includes the step of extracting the parasitic elements from the graphics patterns corresponding to the paths to be analyzed for crosstalk. In such an embodiment, not only the paths that will cause delays exceeding the predetermined amount of time, but also paths that will cause crosstalk noise between adjacent interconnection lines can be extracted. As a result, the simulated operation timing of the integrated circuit can be even closer to the actual operation timing of the circuit.

BRIEF DESCRIPTION OF THE DRAWINGS

FIG. 3 illustrates a list of paths for use in explaining how to extract parasitic elements in the method of the first embodiment.

FIG. 5 illustrates the contents of a target path file, in which target paths with parasitic elements to be extracted are stored, for use in the method of the first embodiment.

FIG. 8 illustrates the contents of wire length information for use in extracting parasitic elements in the method of the second embodiment.

FIG. 9 illustrates the contents of a target path file, in which target paths with parasitic elements to be extracted are stored, for use in the method of the second embodiment.

FIG. 13 illustrates the contents of parallel line length information for use in the method of the third embodiment.

FIG. 14 illustrates the contents of a target path file, in which target paths with parasitic elements to be extracted are stored, for use in the method of the third embodiment.

FIG. 17 illustrates the contents of a target path file, in which target paths with parasitic elements to be extracted are stored, for use in the method of the fourth embodiment.

FIG. 21 illustrates the contents of a delay table for use in extracting parasitic elements in the method of the fifth embodiment.

FIG. 25 illustrates the contents of a delay analysis path file, in which paths to be analyzed for delays are stored, for use in extracting parasitic elements in the method of the sixth embodiment.

FIG. 26 illustrates the contents of a crosstalk analysis path file, in which paths to be analyzed for crosstalk are stored, for use in extracting parasitic elements in the method of the sixth embodiment.

DESCRIPTION OF THE PREFERRED EMBODIMENTS

Embodiment 1

Hereinafter, a first embodiment of the present invention will be described with reference to the accompanying drawings.

Figure 1:
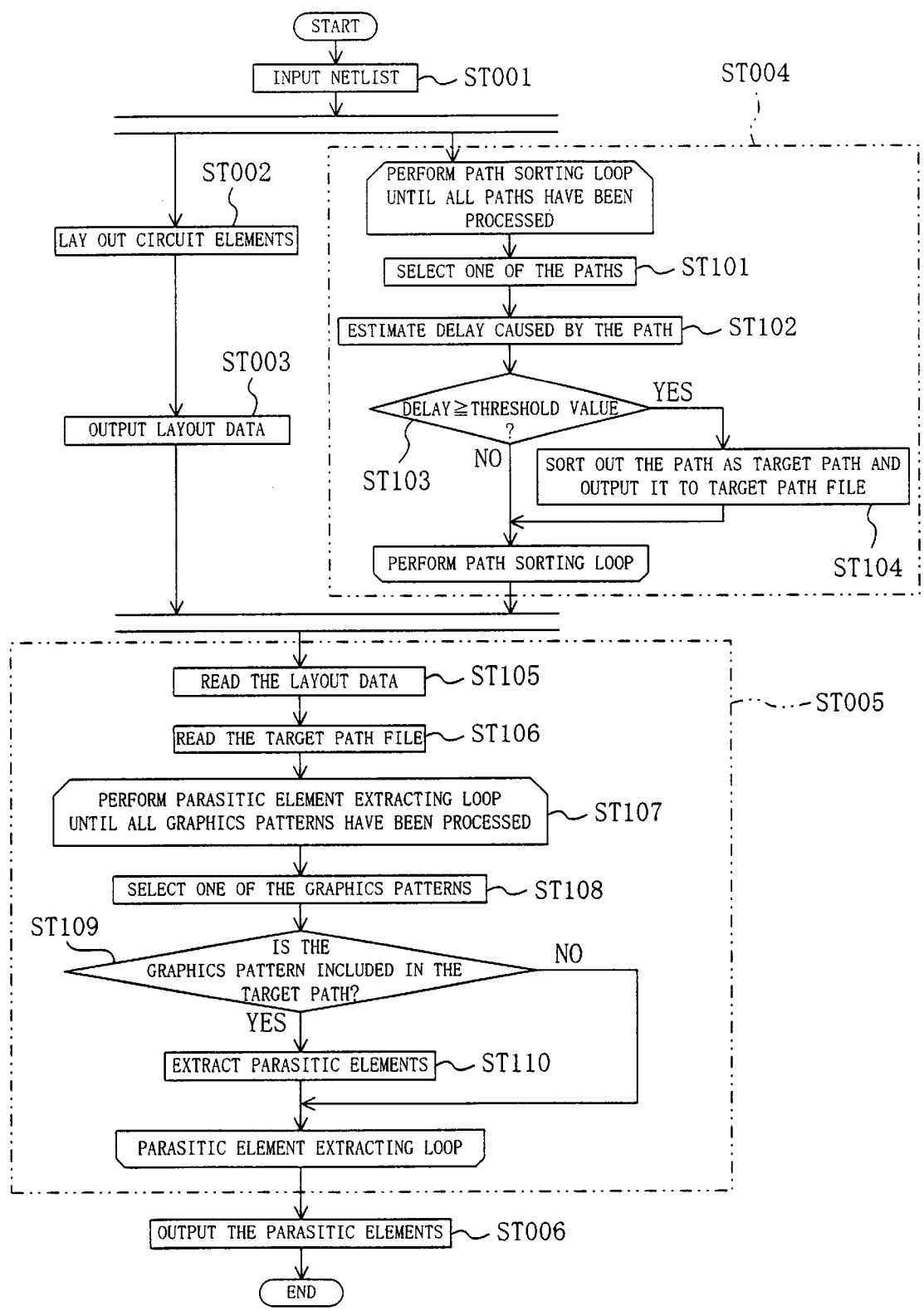
FIG. 1 illustrates a flowchart showing respective process steps for extracting parasitic elements in a method for designing a semiconductor integrated circuit according to a first embodiment of the present invention.

FIG. 1 illustrates the flow of a process for extracting parasitic elements in a method for designing a semiconductor integrated circuit according to the first embodiment. In the illustrated embodiment, input data such as a netlist and output data like layout data are both supposed to have to file format that can be handled by a computer-aided design tool controlled by a central processing unit (CPU).

First, in Step ST001, a netlist is read. The netlist describes topology information about interconnections among multiple circuit elements (e.g., logic devices) that will together make a semiconductor integrated circuit, on which timing analysis (or simulation) should be carried out. Generally speaking, a netlist describes only information about interconnections among the terminals of circuit elements, not information about the wire lengths of interconnection lines or areas where the lines should be placed or laid out.

Next, in Step ST002, the respective circuit elements are physically placed in their layout areas and interconnected together in accordance with the interconnection information described in the netlist read, thereby generating layout data. Then, in Step ST003, the layout data generated is output as an appropriate file.

In parallel with Steps ST002 and ST003, Step ST004 of sorting out paths is performed. In Step ST004, only target paths, from which parasitic elements such as parasitic resistance and capacitance components should be extracted, are sorted out from multiple signal paths defined by the netlist. In the prior art, it takes an enormous amount of time to extract those parasitic components because those components should be estimated for each and every path included in the netlist as described above. In contrast, since only the target paths with parasitic components to be extracted are selectively processed according to the present invention, the parasitic element extraction process is implementable in a practical amount of time.

Hereinafter, Step ST004 will be described in detail.

First, in Step ST101, one of the multiple paths included in the netlist is selected. Next, in Step ST102, a delay that will be caused by the path selected is estimated. In this case, an approximate delay is estimated in Step ST102 for the purpose of sorting out a target path with parasitic elements to be extracted in a subsequent process step. And the delay is assumed to be a gate delay as for a transistor or a provisional line delay as for an interconnection line. Thus, it takes a relatively low computational cost to estimate the gate or provisional line delay.

Then, in Step ST103, the provisional delay estimated in Step ST102 is compared to a predetermined threshold value. In the illustrated embodiment, the threshold value is defined at a value slightly shorter than a delay that will make the circuit under analysis operate erroneously due to the signal propagation delay. In this manner, all the paths are classified into the following two groups. One group of paths will estimatingly cause so short delays that it would be unnecessary to extract any parasitic elements therefrom. The other group of paths will cause delays of such lengths as causing no errors but needing more accurate delay estimation. Subsequently, in Step ST104, the paths that will cause delays equal to or greater than the threshold value are output as a file of paths to be sorted out (which will be herein called a "target path file").

These process steps ST101 through ST104 are performed on each and every path included in the netlist.

Next, Step ST005 of extracting parasitic elements is performed using the layout data generated in Step ST003 and the target path file made in Step ST004.

Hereinafter, Step ST005 will be described in detail.

First, in Step ST105, the layout data, which was output in the previous step ST003, is read. Next, in Step ST106, one of the target paths is read out from the target path file, which was output in the previous step ST104. Thus, it is only necessary to prepare the layout data and the target path file before Step ST005 is started. Also, Steps ST002 and ST004 are supposed to be performed in parallel, but do not have to be carried out concurrently.

Subsequently, in Step ST107, an iterative process starts on all the graphics patterns (i.e., polygon data) included in the layout data. The iterative process begins by selecting one of the polygons included in the layout data in Step ST108. If the graphics pattern selected consists of a graphic primitive (or polygon) representing an interconnection line and at least one other graphics primitive (or polygon) representing a circuit element, then these graphics primitives (or polygons) may be selected as single polygon data.

Next, in Step ST109, it is determined whether or not the graphics pattern selected is included in the target path. If the answer is YES, parasitic elements are extracted in Step ST110 from the target path, including the graphics pattern selected, by a layout parameter extraction (LPE) method, for example. Alternatively, if the answer is NO, then Step ST110 is skipped, thus shortening the total processing time by that needed for Step ST110.

Then, in Step ST006, the parasitic elements, which have been extracted in Step ST110, are output in the form of a file.

Hereinafter, it will be described actually how to extract parasitic elements from a real circuit.

Figure 2:
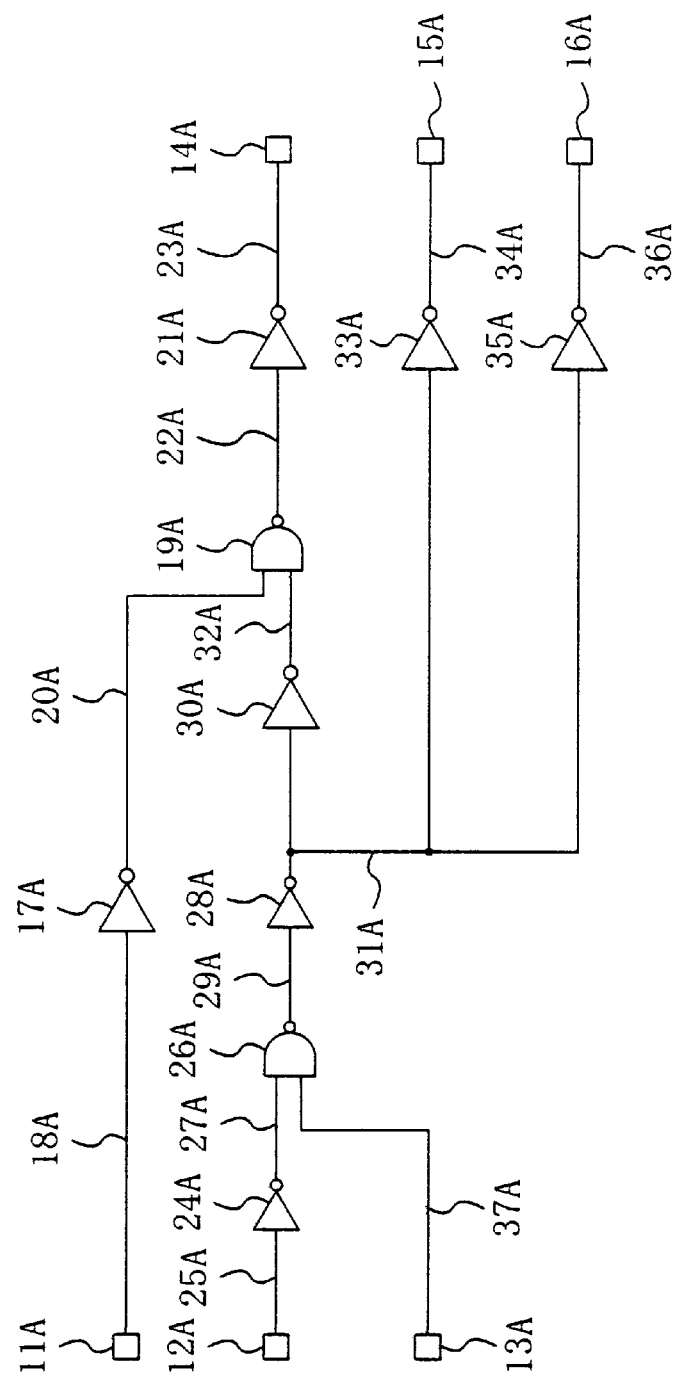
FIG. 2 illustrates a netlist as a logically designed circuit for use in explaining how to extract parasitic elements in the method of the first embodiment.

FIG. 2 illustrates a netlist as a logic circuit diagram for use in explaining how to extract parasitic elements according to the first embodiment. As shown in FIG. 2, the netlist includes seven paths running between start points 11A, 12A and 13A and end points 14A, 15A and 16A. In the illustrated embodiment, each path is a collection of nets including its start and end points and represents the flow of an electrical signal transmitted therethrough.

A first path is composed of first, second, third and fourth nets 18A, 20A, 22A and 23A connected together in this order. The first net 18A connects the first start point 11A and the input terminal of a first inverter (i.e., an exemplary functional element) 17A together. The second net 20A connects the output terminal of the first inverter 17A and one input terminal of a first NAND gate 19A together. The third net 22A connects the output terminal of the first NAND gate 19A and the input terminal of a second inverter 21A together. The fourth net 23A connects the output terminal of the second inverter 21A and the first end point 14A together.

A second path is composed of fifth, sixth, seventh, eighth, ninth, third and fourth nets 25A, 27A, 29A, 31A, 32A, 22A and 23A connected together in this order. The fifth net 25A connects the second start point 12A and the input terminal of a third inverter 24A together. The sixth net 27A connects the output terminal of the third inverter 24A and one input terminal of a second NAND gate 26A together. The seventh net 29A connects the output terminal of the second NAND gate 26A and the input terminal of a fourth inverter 28A together. The eighth net 31A connects the output terminal of the fourth inverter 28A and the input terminal of a fifth inverter 30A together. The ninth net 32A connects the output terminal of the fifth inverter 30A and the other input terminal of the first NAND gate 19A together. And the third and fourth nets 22A and 23A are the same as the counterparts of the first path.

A third path is composed of fifth, sixth, seventh, eighth and tenth nets 25A, 27A, 29A, 31A and 34A connected together in this order. The fifth, sixth and seventh nets 25A, 27A and 29A are the same as those of the second path. In this case, the eighth net 31A connects the output terminal of the fourth inverter 28A and the input terminal of a sixth inverter 33A together. And the tenth net 34A connects the output terminal of the sixth inverter 33A and the second end point 15A together.

A fourth path is composed of fifth, sixth, seventh, eighth and eleventh nets 25A, 27A, 29A, 31A and 36A connected together in this order. The fifth, sixth and seventh nets 25A, 27A and 29A are the same as those of the second and third paths. In this case, the eighth net 31A connects the output terminal of the fourth inverter 28A and the input terminal of a seventh inverter 35A together. And the eleventh net 36A connects the output terminal of the seventh inverter 35A and the third end point 16A together.

The fifth path is composed of twelfth, seventh, eighth, ninth, third and fourth nets 37A, 29A, 31A, 32A, 22A and 23A connected together in this order. The seventh, eighth, ninth, third and fourth nets 29A, 31A, 32A, 22A and 23A are the same as those of the second path. The twelfth net 37A connects the third start point 13A and the other input terminal of the second NAND gate 26A together.

The sixth path is composed of twelfth, seventh, eighth and tenth nets 37A, 29A, 31A and 34A connected together in this order. The seventh, eighth and tenth nets 29A, 31A and 34A are the same as those of the third path. The twelfth net 37A is the same as the counterpart of the fifth path.

The seventh path is composed of twelfth, seventh, eighth and eleventh nets 37A, 29A, 31A and 36A connected together in this order. The seventh, eighth and eleventh nets 29A, 31A and 36A are the same as those of the fourth path. The twelfth net 37A is the same as the counterpart of the fifth and sixth paths.

FIG. 3 illustrates a path list, in which the first through seventh paths (Paths 1 through 7) mentioned above are listed. Functional elements such as inverters may also be included in these paths. For example, the first inverter 17A may be included in Path 1.

Figure 4:
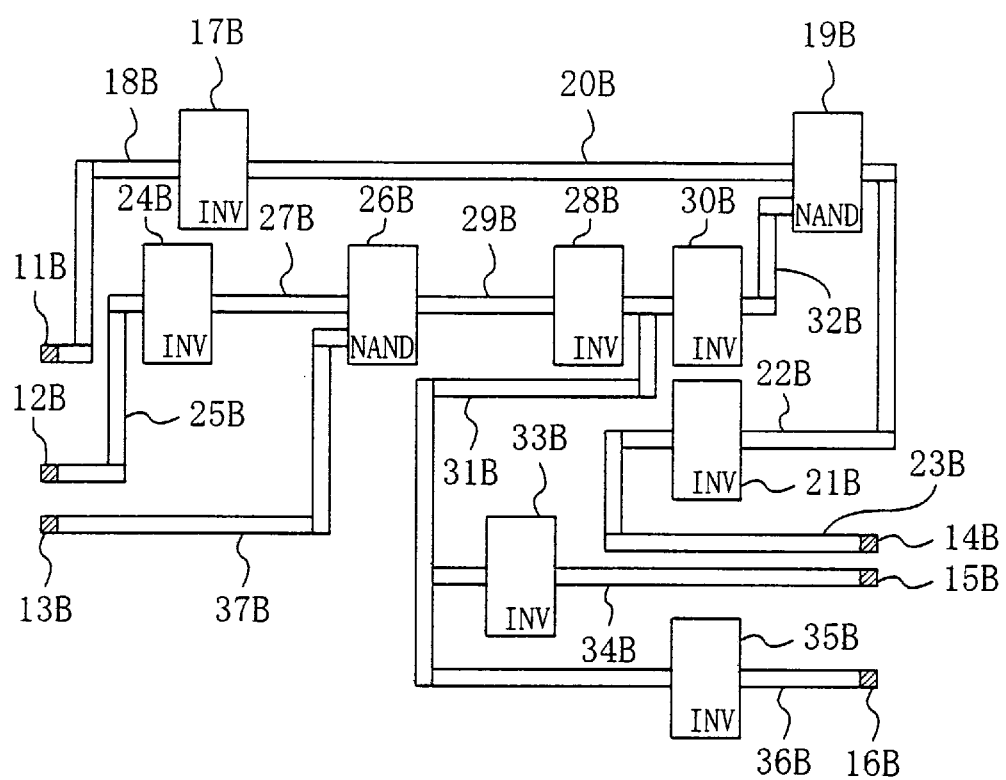
FIG. 4 illustrates a physically designed circuit corresponding to the logical one shown in FIG. 2 and showing layout data for use in explaining how to extract parasitic elements in the method of the first embodiment.

FIG. 4 illustrates a physically designed circuit corresponding to the logical one shown in FIG. 2 and showing the layout data generated in Step ST002. In FIG. 4, a graphics pattern 11B represents a symbol corresponding to the first start point 11A shown in FIG. 2. A graphics pattern 17B represents a cell corresponding to the first inverter 17A shown in FIG. 2. And a graphics pattern 18B represents an interconnection line corresponding to the first net 18A shown in FIG. 2. As can be seen, the layout data is a collection of polygon data.

Figure 5:
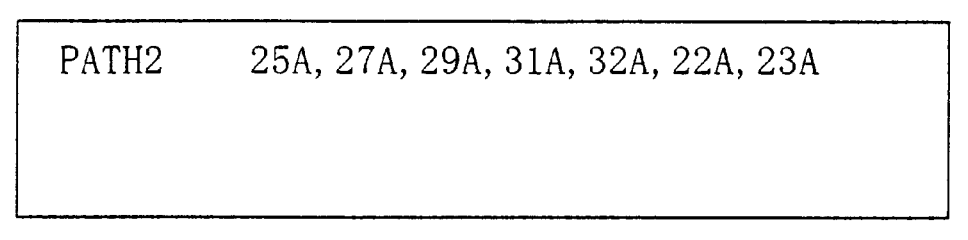

Hereinafter, Step ST004 shown in FIG. 1 will be described in detail with reference to FIGS. 1, 3 and 5.

First, in Step ST101 shown in FIG. 1, one of the multiple paths included in the path list shown in FIG. 3 is selected. For example, suppose Path 1 has been selected first. Next, in Step ST102, it is estimated how much delay will be caused if a signal propagates through the Path 1 selected, i.e., the first, second, third and fourth nets 18A, 20A, 22A and 23A. Then, in Step ST103, the delay estimated in Step ST102 is compared to a threshold value defined at a value slightly shorter than a delay that will make the circuit under analysis operate erroneously. If the estimated delay is equal to or greater than the threshold value, the path in question is sorted out as a target path and output to the target path file in Step ST104. These process steps ST101 through ST104 will be performed on each of the other paths (i.e., Paths 2 through 7) included in the list shown in FIG. 3. As a result, a target path file, with which Path 2 that will cause a delay equal to or greater than the threshold value has been registered as a target path, may be made and output as shown in FIG. 5.

Next, Step ST005 shown in FIG. 1 will be described with reference to FIGS. 1, 2 and 4.

First, in Step ST105 shown in FIG. 1, the layout data shown in FIG. 4 is read. Next, in Step ST106, a target path (i.e., Path 2 in this case) is read out from the target path file and then stored in a main memory of the system. Then, in Step ST108, a graphics pattern 25B shown in FIG. 4 is selected from the layout data, for example. Subsequently, in Step ST109, it is determined whether or not the graphics pattern 25B selected is included in the target path. Since the graphics pattern 25B corresponds to the fifth net 25A included in the target Path 2, parasitic elements are extracted in Step ST110 from the graphics pattern 25B by a predetermined method. However, if a graphics pattern 37B was selected in Step ST108, for example, then no parasitic elements are extracted in Step ST110, because no paths corresponding to the graphics pattern 37B are registered with the target path file.

Figure 6:
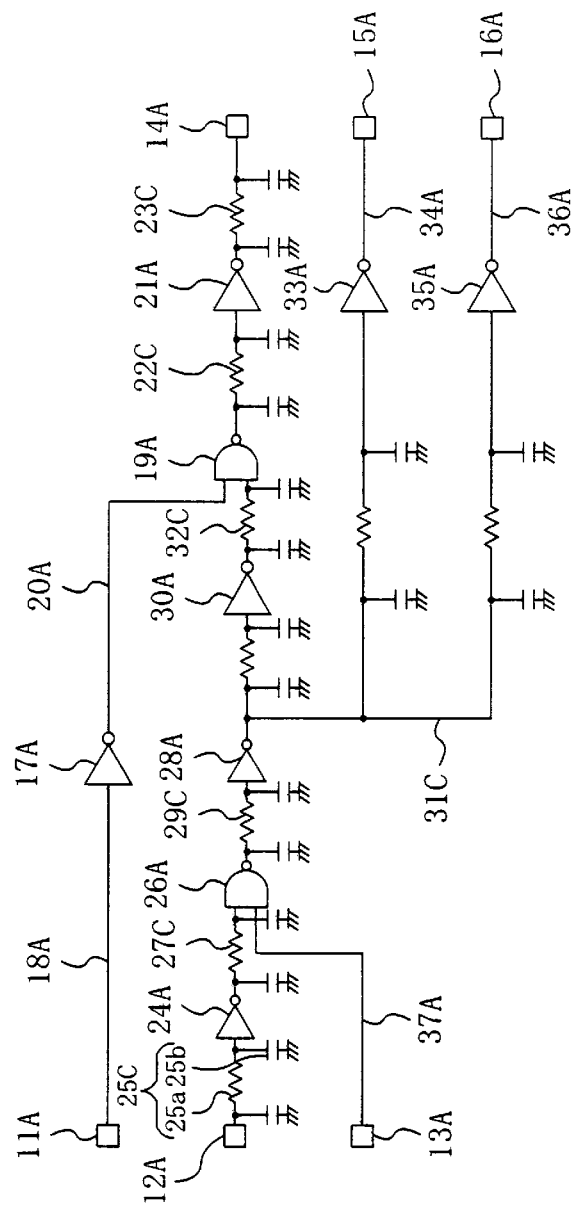
FIG. 6 illustrates a circuit diagram, in which the parasitic elements extracted from the layout data and the logic circuit shown in FIG. 2 are combined, for use in explaining how to extract parasitic elements in the method of the first embodiment.

FIG. 6 illustrates a circuit diagram in which the parasitic elements extracted from the layout data and the logic circuit shown in FIG. 2 are combined. As shown in FIG. 6, parasitic elements 25C, including parasitic resistor 25a and parasitic capacitor 25b, are added to the fifth net 25A included in Path 2.

As described above, according to this embodiment, delays that will be caused by multiple paths, which have been made from a netlist, are estimated and compared to a threshold value and a path that will cause a delay equal to or greater than the threshold value is sorted out as a target path. Thus, parasitic elements do not have to be extracted from all of the graphics patterns included in the layout data, but from only the graphics patterns included in the target path. As a result, the parasitic elements can be extracted in a much shorter time.

In the foregoing embodiment, a path is supposed to be sorted out in Step ST104. Alternatively, nets included in a path in question may be sorted out and output in the form of a target net file. In such a case, it is determined in Step ST109 whether or not a graphics pattern selected is included in the target net file. The target net file maybe in any appropriate file format. For example, the net file may be written as shown in FIG. 5 except the descriptor "Path 2".

Embodiment 2

Next, a second embodiment of the present invention will be described with reference to the accompanying drawings.

Figure 7:
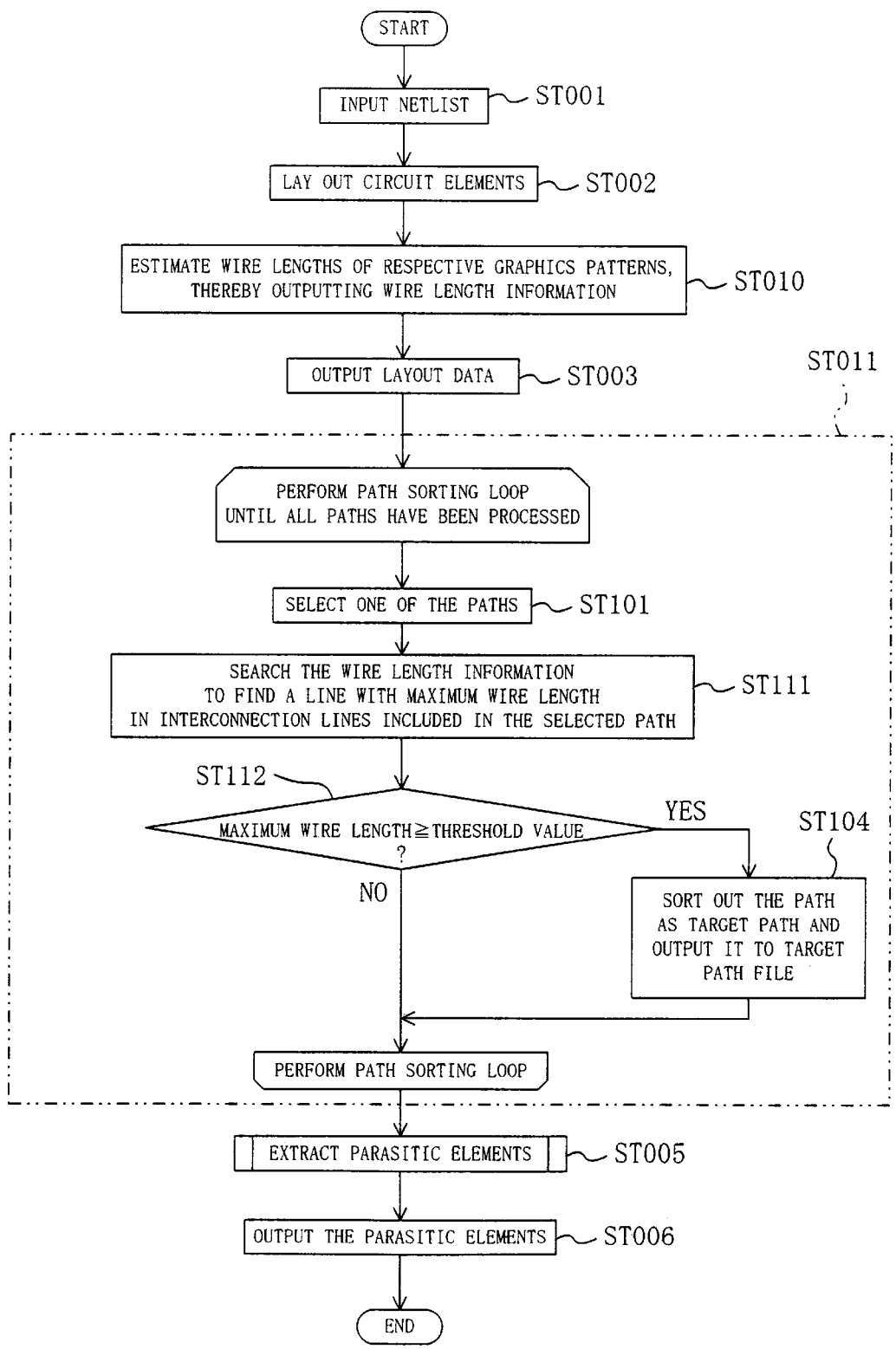
FIG. 7 illustrates a flowchart showing respective process steps for extracting parasitic elements in a method for designing a semiconductor integrated circuit according to a second embodiment of the present invention.

FIG. 7 illustrates the flow of a process for extracting parasitic elements in a method for designing a semiconductor integrated circuit according to the second embodiment. In FIG. 7, the same process steps as those illustrated in FIG. 1 are identified by the same reference numerals.

First, in Step ST001, a netlist is read. The netlist describes topology information about interconnections among multiple circuit elements that will together make a semiconductor integrated circuit, on which timing simulation should be carried out.

Next, in Step ST002, the respective circuit elements are physically placed in their layout areas and interconnected together in accordance with the interconnection information described in the netlist read, thereby generating layout data.

Then, in Step ST010, graphics patterns, corresponding to interconnection lines, are extracted from the layout data generated, and respective wire lengths are estimated for these graphics patterns extracted, thereby outputting wire length information. The wire length of an interconnection line is closely related to a signal propagation delay. That is to say, the longer the interconnection line, the more seriously the transfer rate is affected by parasitic elements associated with the line. Subsequently, in Step ST003, the layout data generated is output.

Hereinafter, Step ST011 of sorting out a path will be described.

First, in Step ST101, one of the multiple paths included in the netlist or path list is selected. Next, in Step ST111, the wire length information output in Step ST010 is searched to find and sort out an interconnection line with a maximum or quasi-maximum wire length from the multiple interconnection lines included in the selected path. The wire lengths of these interconnection lines are estimated based on the layout data representing the graphics patterns corresponding to these interconnection lines.

Then, in Step ST112, the wire length of the interconnection line sorted out in Step ST111 is compared to a predetermined threshold value. In the illustrated embodiment, the threshold value is defined at a length slightly shorter than a wire length that will make the circuit under analysis operate erroneously. A path, including that interconnection line with the wire length equal to or greater than the threshold value, will be greatly affected by parasitic elements in terms of its signal propagation delay. Thus, the parasitic elements should be extracted from the interconnection line with the wire length equal to or greater than the threshold value and analyzed in detail. Next, these process steps ST111 and ST112 will be performed on each and every other path included in the netlist.

Thereafter, Steps ST005 and ST006 are performed as in the first embodiment.

Hereinafter, it will be described with reference to the FIGS. 2 and 4 specifically how to perform Step ST011.

FIG. 8 illustrates the wire length information output in Step ST010 shown in FIG. 7. For example, the graphics patterns (or interconnection lines) 18B and 20B, corresponding to the first and second nets 18A and 20A, have wire lengths of 20 and 70 µm, respectively, as shown in FIG. 8.

Suppose Path 1 has been selected in Step ST101. As can be seen from the path list illustrated in FIG. 3, Path 1 includes the first, second, third and fourth nets 18A, 20A, 22A and 23A.

Next, in Step ST111, the wire length information shown in FIG. 8, representing the pre-estimated wire lengths of respective graphics patterns corresponding to the nets for the paths, is searched to find an interconnection line with a maximum wire length. As a result, it is found that the interconnection line 20B, corresponding to the second net 20A included in Path 1, has a maximum length of 70 µm. Thus, the interconnection line 20B is sorted out.

Supposing the threshold value for the maximum wire length is 50 µm, for example, it is determined in Step ST112 that the wire length of 70 µm of the interconnection line 20B, corresponding to the second net 20A, is greater than the threshold value. Thus, in Step ST104, Path 1 is output as a target path to the target path file.

Step ST011 will be performed on each of the other Paths 2 through 7. Then, each and every other interconnection line included in these paths 2 through 7 will turn out to be shorter than the threshold value of 50 µm. As a result, a target path file consisting of only Path 1 is obtained as shown in FIG. 9.

Figure 10:
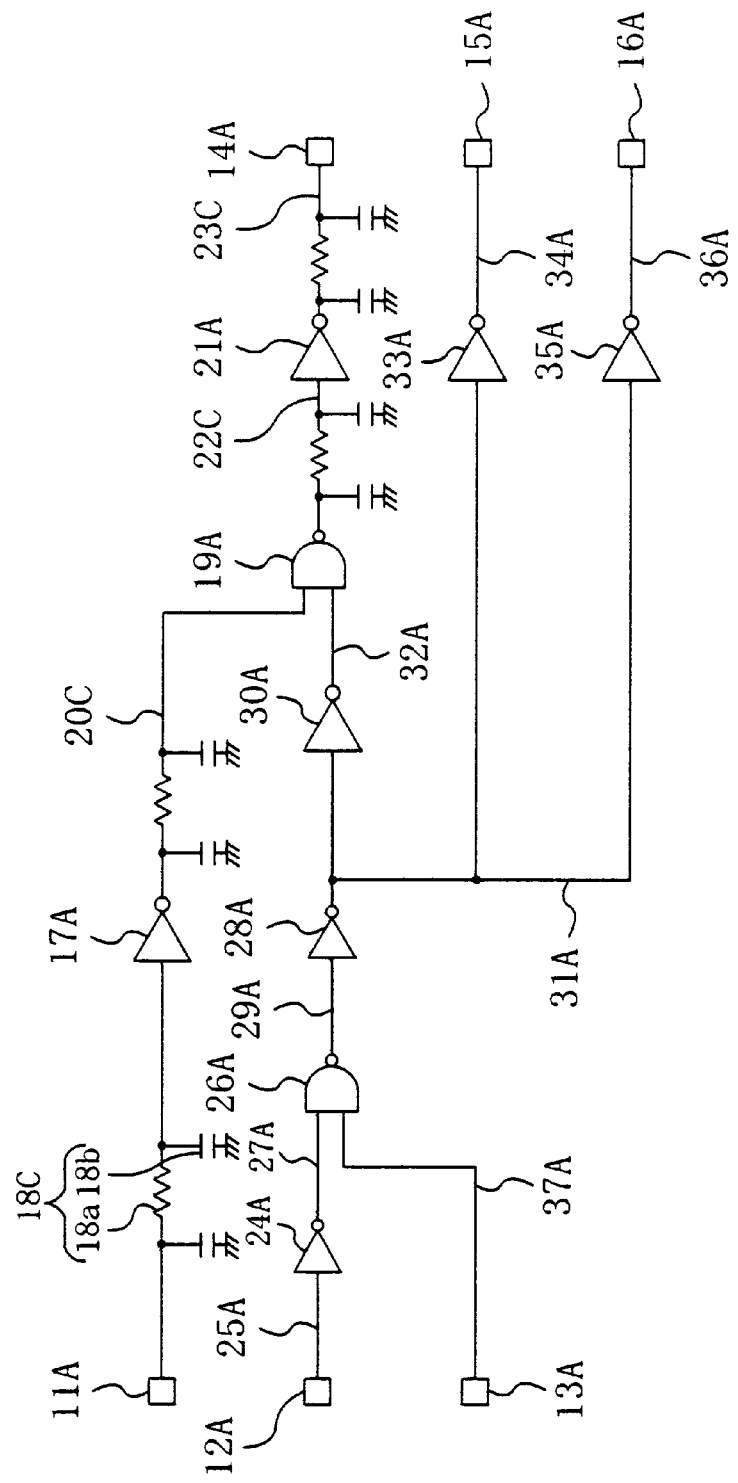
FIG. 10 illustrates a circuit diagram, in which the parasitic elements extracted from the layout data and the logic circuit shown in FIG. 2 are combined, for use in explaining how to extract parasitic elements in the method of the second embodiment.

FIG. 10 illustrates a circuit diagram in which the parasitic elements for the path, including the interconnection line with the wire length equal to or greater than the threshold value, and the logic circuit shown in FIG. 2 are combined. As shown in FIG. 10, parasitic elements 18C, including parasitic resistor 18a and parasitic capacitor 18b, are added to the first net 18A included in Path 1.

In this manner, according to the second embodiment, a path, including an interconnection line with an estimated wire length equal to or greater than a predetermined threshold value, is sorted out in advance as a target path from multiple paths that have been made from the netlist. Thus, parasitic elements do not have to be extracted from all of the graphics patterns included in the layout data, but from only the graphics patterns included in the target path. As a result, the parasitic elements can be extracted in a much shorter time.

Optionally, a total wire length of interconnection lines included in each path may be estimated in Step ST111. In such an embodiment, however, a new threshold value should be defined for the maximum wire length.

Embodiment 3

Next, a third embodiment of the present invention will be described with reference to the accompanying drawings.

Figure 11:
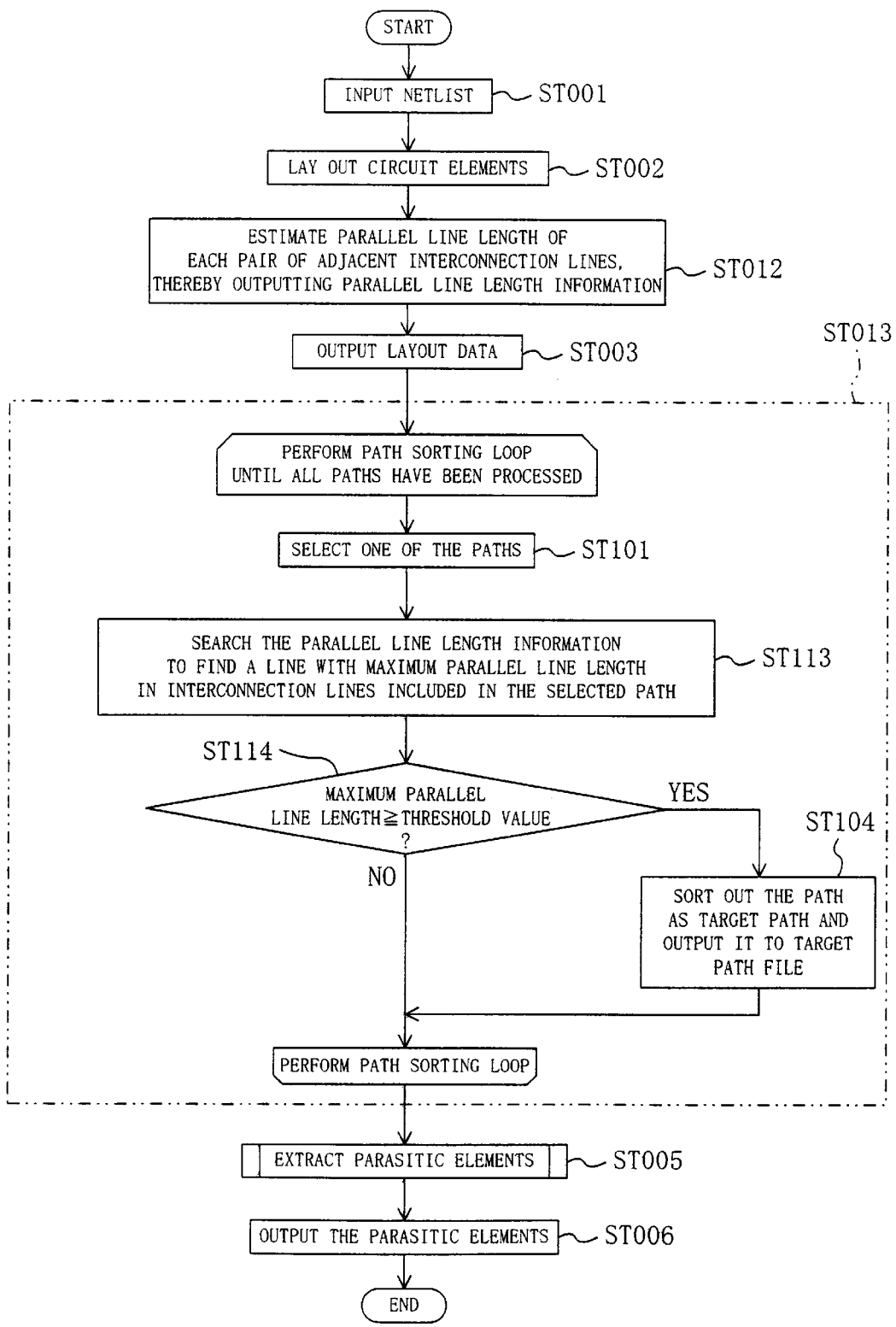
FIG. 11 illustrates a flowchart showing respective process steps for extracting parasitic elements in a method for designing a semiconductor integrated circuit according to a third embodiment of the present invention.

FIG. 11 illustrates the flow of a process for extracting parasitic elements in a method for designing a semiconductor integrated circuit according to the third embodiment. In FIG. 11, the same process steps as those illustrated in FIG. 7 are identified by the same reference numerals.

First, in Step ST001, a netlist is read. The netlist describes topology information about interconnections among multiple circuit elements that will together make a semiconductor integrated circuit, on which timing simulation should be carried out.

Next, in Step ST002, the respective circuit elements are physically placed in their layout areas and interconnected together in accordance with the interconnection information described in the netlist read, thereby generating layout data.

Then, in Step ST012, at least one pair of mutually adjacent graphics patterns are sorted out from the graphics patterns, corresponding to respective interconnection lines, in the layout data generated. And the length of mutually parallel portions of the pair of graphics patterns sorted out is estimated, thereby outputting parallel line length information. In general, any pair of mutually adjacent interconnection lines affect each other, thus possibly increasing a signal propagation delay. Accordingly, the longer the parallel line length of two interconnection lines, the more seriously the transfer rate is affected by the length. Subsequently, in Step ST003, the layout data generated is output.

Hereinafter, Step ST013 of sorting out a path will be described.

First, in Step ST101, one of the multiple paths included in the netlist is selected.

Next, in Step ST113, the parallel line length information output in Step ST012 is searched to find interconnection lines, which are included in the path selected and are parallel to other interconnection lines included in other paths adjacent to the path selected. These interconnection lines are represented by their graphics patterns in accordance with the layout data. And one of the interconnection lines with a maximum parallel line length is sorted out.

Then, in Step ST114, the maximum parallel line length of the interconnection line sorted out in Step ST113 is compared to a predetermined threshold value. In the illustrated embodiment, the threshold value is defined at a length slightly shorter than a parallel line length that will make the circuit under analysis operate erroneously. A pair of paths, including the interconnection lines with the parallel line length equal to or greater than the threshold value, will be greatly affected by parasitic elements in terms of their signal propagation delays. Thus, the parasitic elements should be extracted from that pair of interconnection lines with the parallel line length equal to or greater than the threshold value and analyzed in further detail. These process steps ST113 and ST114 will be performed on each and every other path included in the netlist.

Thereafter, Steps ST005 and ST006 are performed as in the second embodiment.

Hereinafter, it will be described with reference to FIGS. 2 and 4 specifically how to perform Step ST013.

Figure 12:
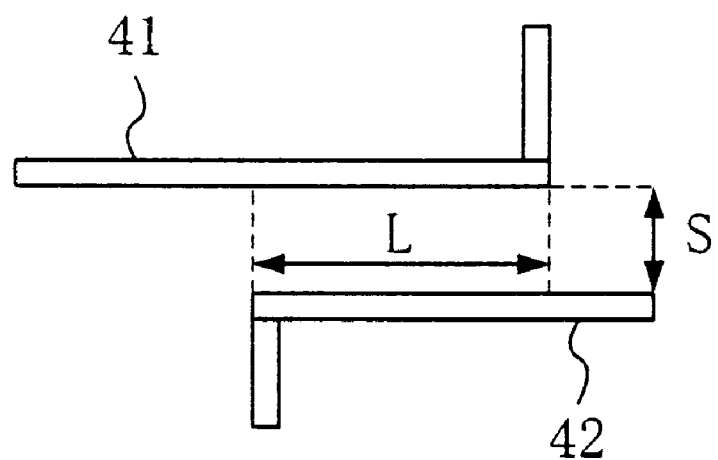
FIG. 12 illustrates how to define a parallel line length for the layout data for use in extracting parasitic elements in the method of the third embodiment.

The "parallel line length" is herein defined as follows. FIG. 12 illustrates first and second interconnection lines 41 and 42 that are placed to be partially adjacent to each other. As shown in FIG. 12, a pair of portions of the first and second interconnection lines 41 and 42, which extend in parallel and are adjacent to each other with a space S interposed therebetween, is herein regarded as having a parallel line length L. Accordingly, the "parallel portions" do not have to be exactly parallel to each other in a geometric sense.

FIG. 13 illustrates parallel line length information that has been output in Step ST012 shown in FIG. 11. For example, Item 0001 represents that a pair of mutually adjacent graphics patterns (or interconnection lines) 18B and 25B, corresponding to the first and fifth nets 18A and 25A belonging to Paths 1 and 2, respectively, has a space S of 1 μm and a parallel line length L of 59 μm.

Suppose Path 1 has been selected in Step ST101. As can be seen from the path list illustrated in FIG. 3, Path 1 is composed of first, second, third and fourth nets 18A, 20A, 22A and 23A. As represented by the parallel line length information shown in FIG. 13, the underlined items 0001, 0005, 0008, 0009 and 0010 contain information about Path 1. Comparing these items to each other, a parallel line length L of 25 μm as represented by Item 0010 is the maximum parallel line length as for Path 1.

Next, in Step ST113, the parallel line length information shown in FIG. 13, representing the pre-estimated parallel line lengths of graphics patterns corresponding to respective nets for the paths, is searched to find an interconnection line with a maximum parallel line length. As a result, the interconnection line 238, included in Path 1, turns out to have the maximum parallel line length of 25 μm. Thus, this interconnection line 23B is extracted.

Supposing the threshold value for the maximum parallel line length is 20 μm, for example, it is determined in Step ST114 that the maximum parallel line length of 25 μm of the interconnection line 23B included in Path 1 is greater than the threshold value. Thus, in Step ST104, this Path 1 is sorted out as a target path and output to the target path file. A similar process will be performed on each of the other paths. As a result, a target path file, consisting of Paths 1, 2, 3, 5 and 6, will be made as shown in FIG. 14.

Figure 15:
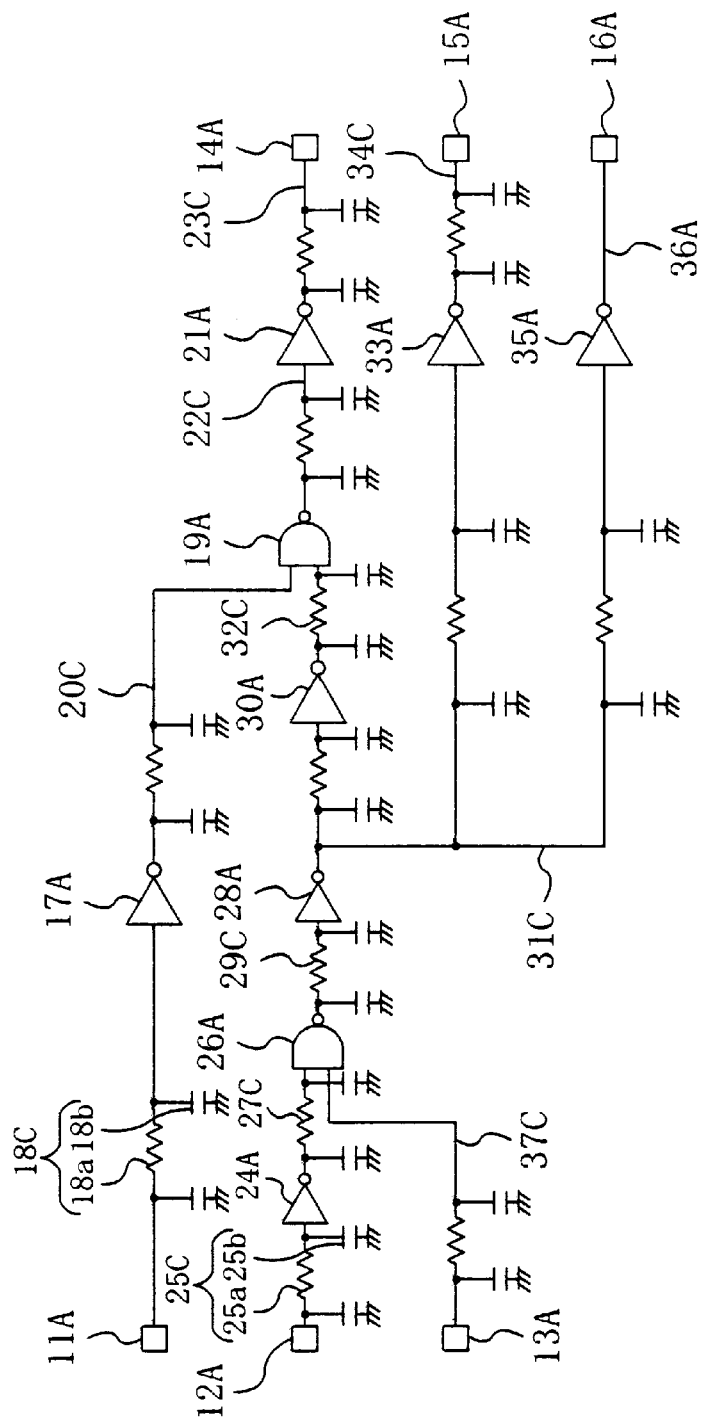
FIG. 15 illustrates a circuit diagram, in which the parasitic elements extracted from the layout data and the logic circuit shown in FIG. 2 are combined, for use in explaining how to extract parasitic elements in the method of the third embodiment.

FIG. 15 illustrates a circuit diagram in which the parasitic elements for the paths, including the interconnection lines with the parallel line length equal to or greater than the threshold value, and the logic circuit shown in FIG. 2 are combined. As shown in FIG. 15, parasitic elements 18C, including parasitic resistor 18a and parasitic capacitor 18b, are added to the first net 18A included in Path 1. And parasitic elements 25C, including parasitic resistor 25a and parasitic capacitor 25b, are added to the fifth net 25A included in Path 2 adjacent to Path 1.

In this manner, according to the third embodiment, at least one pair of parallel paths, including interconnection lines with a parallel line length equal to or greater than a threshold value, is sorted out in advance as target paths from multiple paths made from the netlist. Thus, parasitic elements do not have to be extracted from all of the graphics patterns included in the layout data, but from only the graphics patterns included in the target paths. As a result, the parasitic elements can be extracted in a much shorter time.

Optionally, a total parallel line length of interconnection lines included in each path may be estimated in Step ST113. In such an embodiment, however, a new threshold value should be defined for the maximum parallel line length.

Embodiment 4

Figure 16:
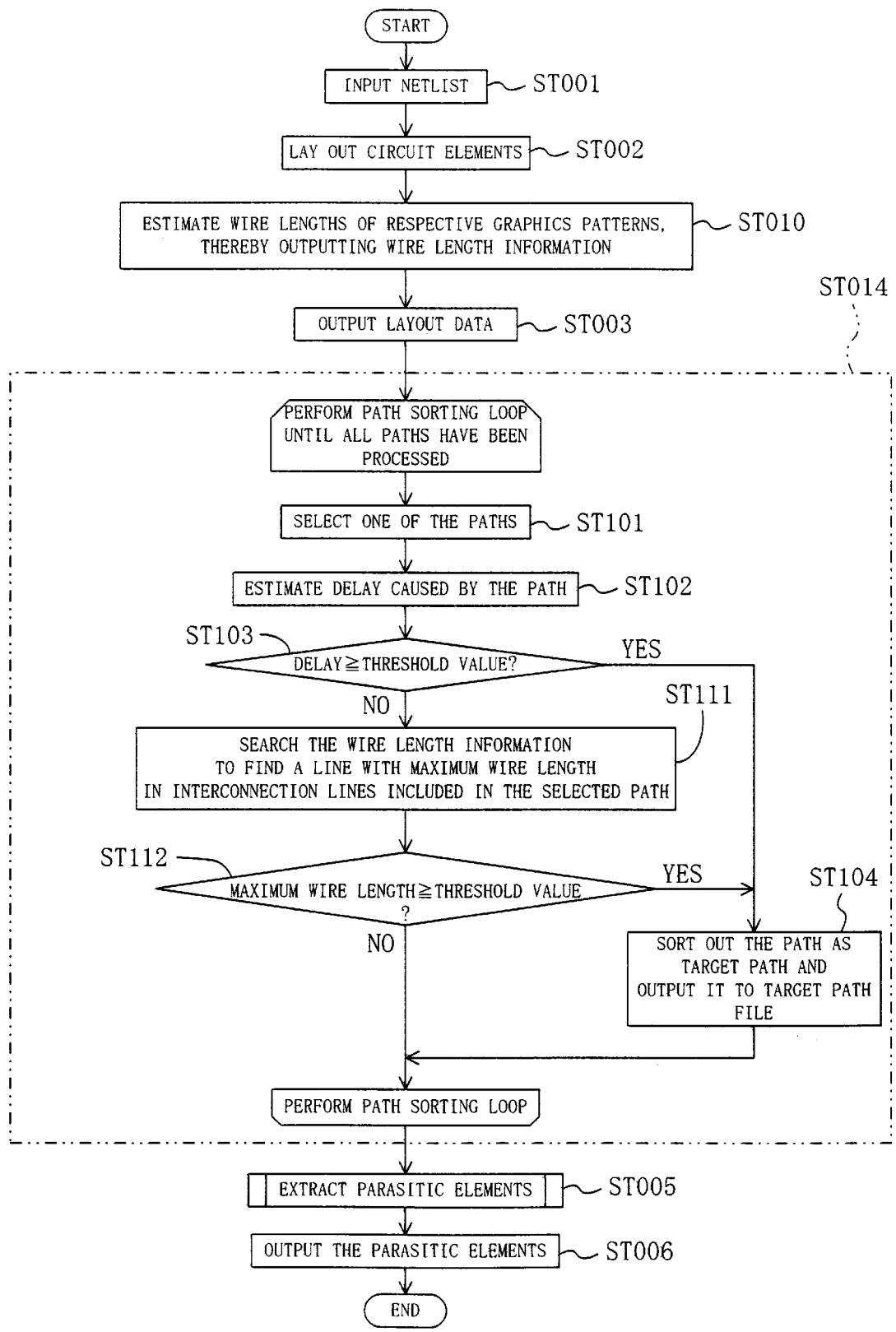
FIG. 16 illustrates a flowchart showing respective process steps for extracting parasitic elements in a method for designing a semiconductor integrated circuit according to a fourth embodiment of the present invention.

Next, a fourth embodiment of the present invention will be described with reference to the accompanying drawings. FIG. 16 illustrates the flow of a process for extracting parasitic elements in a method for designing a semiconductor integrated circuit according to the fourth embodiment. In FIG. 16, the same process steps as those illustrated in FIG. 7 are identified by the same reference numerals and the description thereof will be omitted herein.

As shown in FIG. 16, the path sorting step ST014 according to the fourth embodiment includes Step ST103 of comparing the delay that will be caused by each path to a threshold value and Step ST112 of comparing the maximum wire length to another threshold value. These Steps ST103 and ST112 are performed on each of the paths included in the netlist. Accordingly, even if a path is expected to cause a delay less than the threshold value but includes an interconnection line with a wire length equal to or greater than the threshold value or if another path includes no interconnection lines with wire lengths equal to or greater than the threshold value but is expected to cause a delay equal to or greater than the threshold value, the paths of both of these types will be sorted out as target paths. Thus, in the subsequent parasitic element extracting step ST005, the number of parasitic elements missed can be reduced. As a result, the timing simulation can be carried out more accurately in an even shorter time.

If this embodiment is applied to the logic circuit shown in FIG. 2, then Paths 2 and 1 will be sorted out in Steps ST103 and ST112, respectively, and output to the target path file as shown in FIG. 17.

Figure 18:
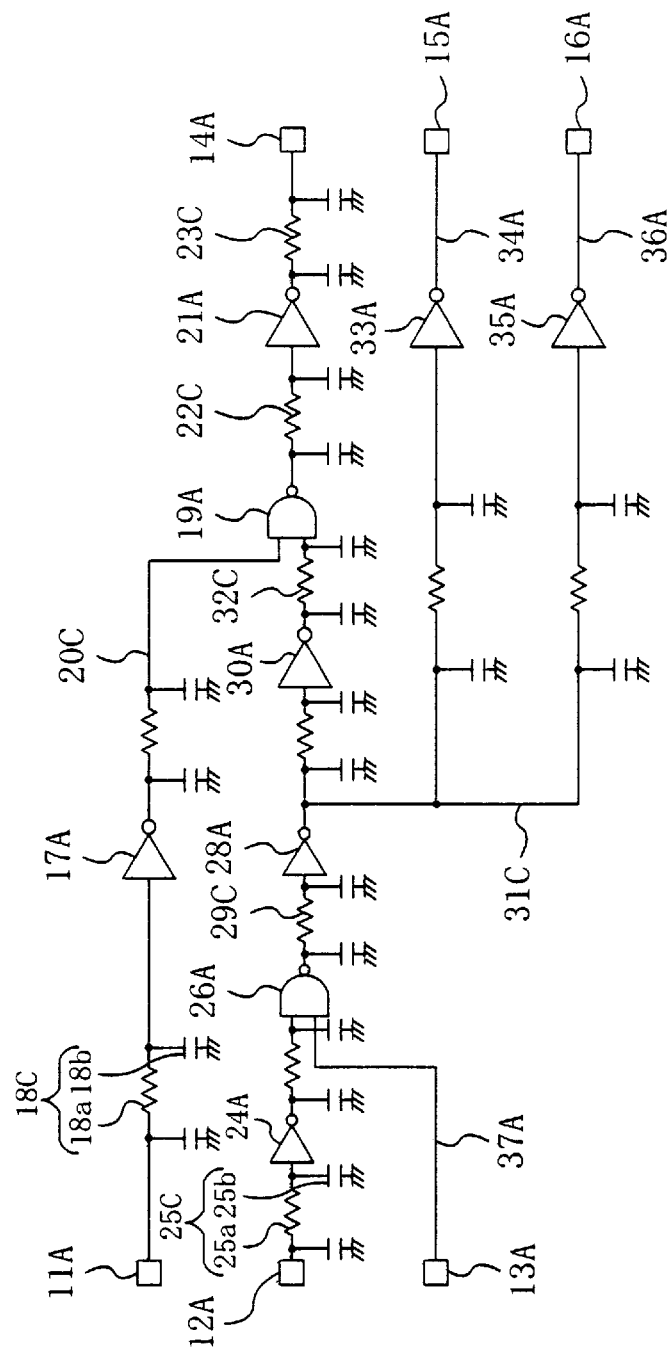
FIG. 18 illustrates a circuit diagram, in which the parasitic elements extracted from the layout data and the logic circuit shown in FIG. 2 are combined, for use in explaining how to extract parasitic elements in the method of the fourth embodiment.

FIG. 18 illustrates a circuit diagram in which parasitic elements for a path that will cause a delay equal to or greater than a threshold value and/or a path including an interconnection line with a wire length equal to or greater than another threshold value, and the logic circuit shown in FIG. 2 are combined. As shown in FIG. 18, parasitic elements 18C, including parasitic resistor 18a and parasitic capacitor 18b, are added to the first net 18A included in Path 1. And parasitic elements 25C, including parasitic resistor 25a and parasitic capacitor 25b, are added to the fifth net 25A included in Path 2 adjacent to Path 1.

In this manner, according to the fourth embodiment, a path that will cause a delay equal to or greater than a threshold value and/or a path including an interconnection line with a wire length equal to or greater than another threshold value is/are sorted out in advance as target path(s) from multiple paths made from the netlist. Thus, parasitic elements do not have to be extracted from all of the graphics patterns included in the layout data, but from only the graphics patterns included in the target path(s). As a result, the parasitic elements can be extracted in a much shorter time and the number of parasitic elements missed can be reduced.

Optionally, a total wire length of interconnection lines included in each path may be estimated in Step ST111. In such an embodiment, however, a new threshold value should be defined for the maximum wire length.

Modified Example of Embodiment 4

Next, a modified example of the fourth embodiment will be described with reference to the accompanying drawings.

Figure 19:
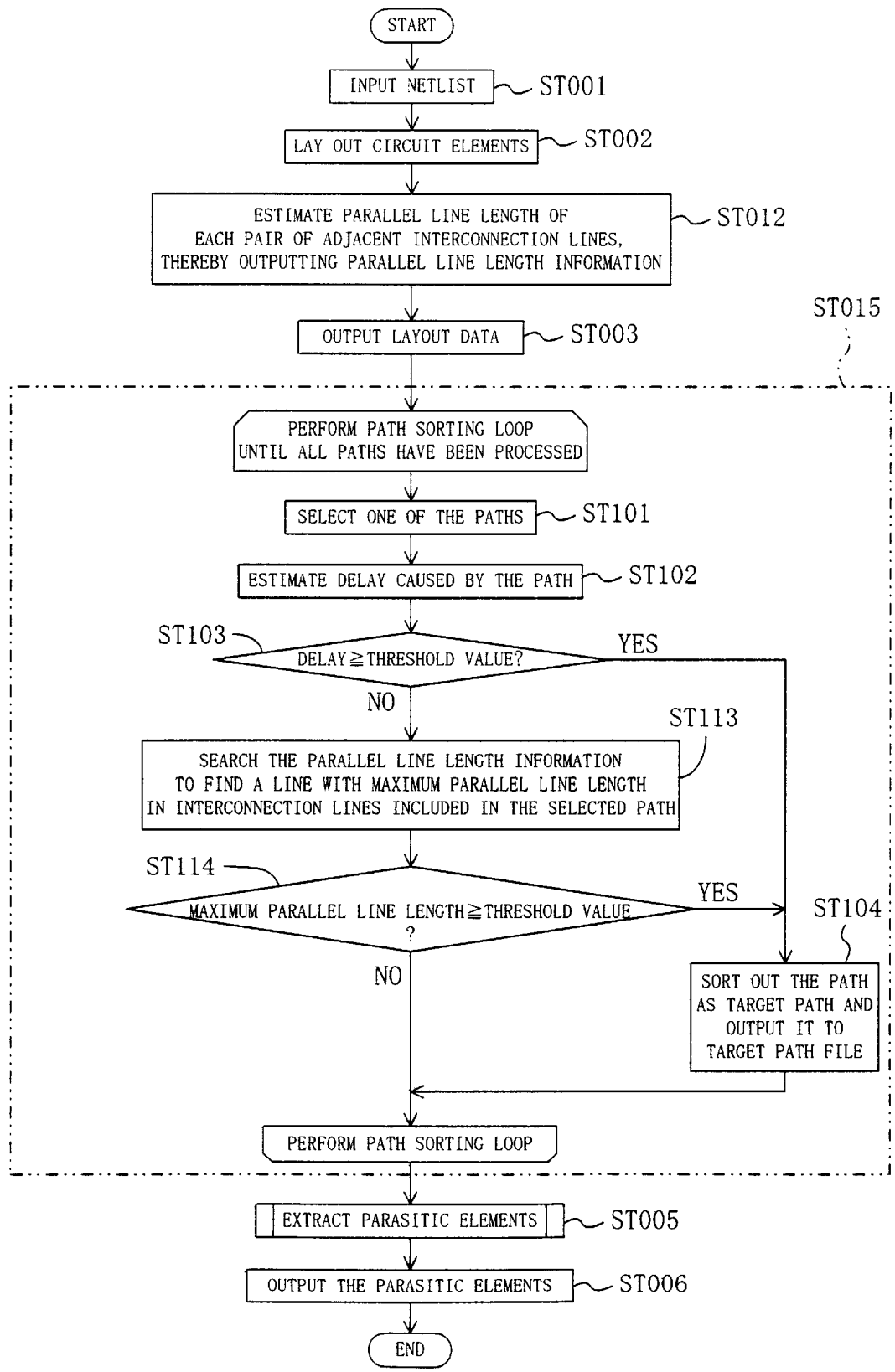
FIG. 19 illustrates a flowchart showing respective process steps for extracting parasitic elements in a method for designing a semiconductor integrated circuit according to a modified example of the fourth embodiment.

FIG. 19 illustrates the flow of a process for extracting parasitic elements in a method for designing a semiconductor integrated circuit according to the modified example of the fourth embodiment. In this modified example, after the delay that will be caused by the path selected is compared to the threshold value in Step ST103, an interconnection line with a maximum wire length is not sorted out from the path to extract the parasitic elements unlike the fourth embodiment. Instead, as in the third embodiment, Steps ST113 and ST114 are performed based on the length of the parallel portions of a pair of mutually adjacent interconnection lines to extract the parasitic elements as shown in FIG. 19. Thus, if this modified example is applied to the logic circuit shown in FIG. 2 and the layout data shown in FIG. 4, then the target path file, reflecting the parallel line length information shown in FIG. 14 about mutually adjacent paths, will be made.

In this manner, according to this modified example, a path that will cause a delay equal to or greater than a threshold value and/or a pair of paths including mutually adjacent interconnection lines with a parallel line length equal to or greater than another threshold value is/are sorted out in advance as target path(s) from multiple paths made from the netlist. Thus, parasitic elements do not have to be extracted from all of the graphics patterns included in the layout data, but from only the graphics patterns included in the target path(s). As a result, the parasitic elements can be extracted in a much shorter time and the number of parasitic elements missed can be reduced.

Embodiment 5

Next, a fifth embodiment of the present invention will be described with reference to the accompanying drawings.

Figure 20:
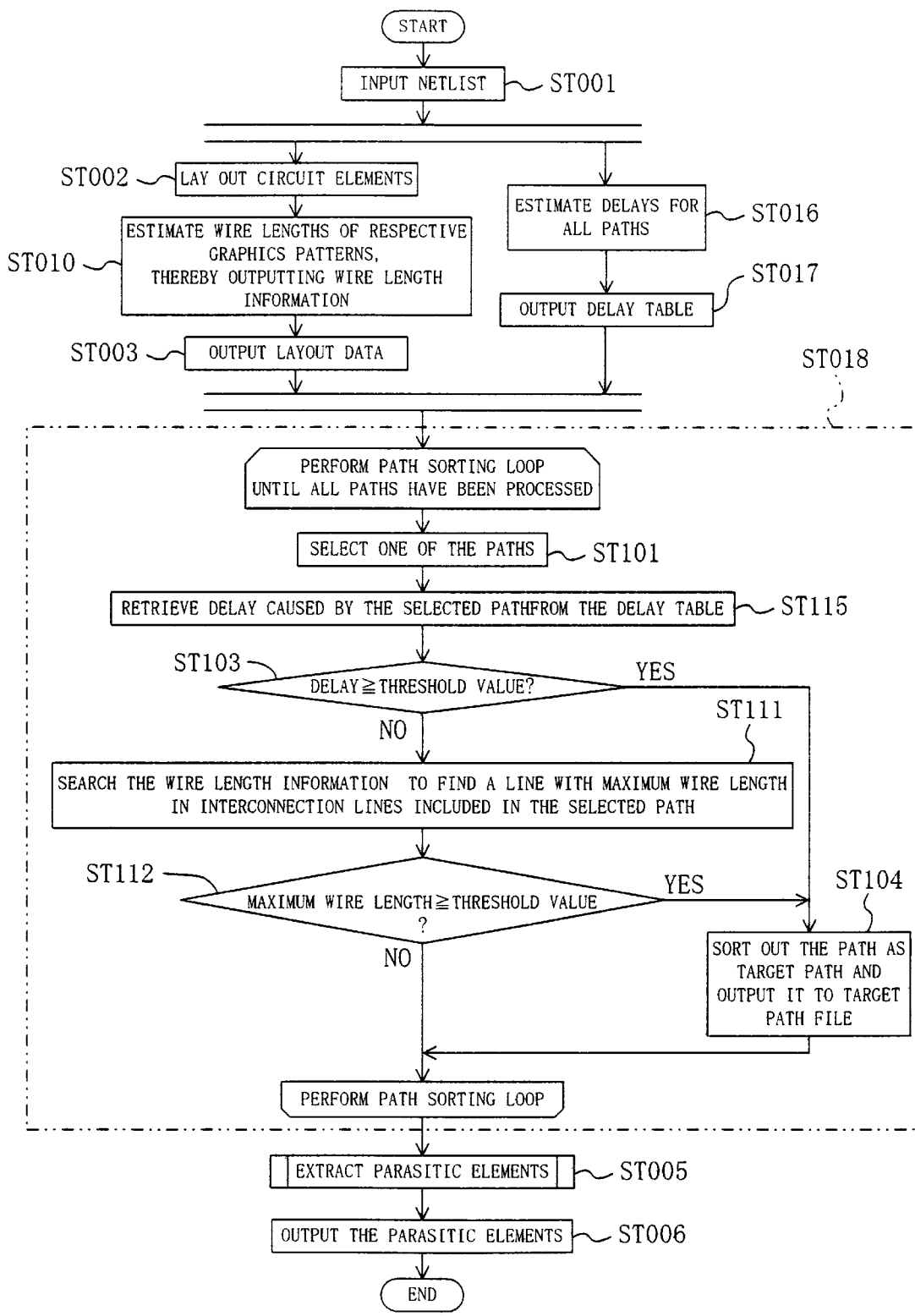
FIG. 20 illustrates a flowchart showing respective process steps for extracting parasitic elements in a method for designing a semiconductor integrated circuit according to a fifth embodiment of the present invention.

FIG. 20 illustrates the flow of a process for extracting parasitic elements in a method for designing a semiconductor integrated circuit according to the fifth embodiment. In FIG. 20, the same process steps as those illustrated in FIG. 1 or 7 are identified by the same reference numerals.

In the fourth embodiment shown in FIG. 16, after the layout data has been made, a delay that will be caused by each path is estimated in the path sorting step ST014. However, according to the fifth embodiment, the delay is estimated for each path while the layout data is being made.

Specifically, after the netlist has been input in Step ST001, delays are estimated for respective paths in Step ST016 using the netlist input as shown in FIG. 20. Next, in Step ST017, the estimated delays are output in the form of a delay table. FIG. 21 illustrates an exemplary delay table obtained when this embodiment is applied to the logic circuit shown in FIG. 2. For example, Path 1, running from the first start point 11A through the first end point 14A, will cause a delay of 1.2 ns as shown in FIG. 21. The delay table may be either stored in an internal memory or output as a file to an external memory.

In parallel with Step ST017, Steps ST002, ST010 and ST003 are carried out. And after both the delay table and the layout data have been prepared, a path sorting step ST018 according to the fifth embodiment is started.

Hereinafter, Step ST019 will be described in detail.

First, in Step ST101, one of the multiple paths included in the netlist or path list is selected. Next, in Step ST115, the delay that will be caused by the path selected is retrieved from the delay table prepared. Suppose the threshold value of the delay is 2.0 ns. Path 2 will cause a delay of 2.4 ns as shown in FIG. 21, which is found greater than the threshold value in Step ST103. Accordingly, Path 2 is sorted out as a target path from the delay table shown in FIG. 21. Subsequently, Steps ST111 and ST112 are carried out to sort out an interconnection line with a maximum wire length and then compare the maximum wire length to a threshold value. As a result, Path 1 is sorted out as another target path by reference to the wire length information shown in FIG. 8.

In this manner, according to the fifth embodiment, delays are estimated in advance for respective paths while the layout data is being made, instead of estimating a delay for each path in the path sorting step ST018. Thus, in Step ST018, a target path can be found just by reference to the delay table. As a result, the path can be sorted out in a much shorter amount of time.

Optionally, a total wire length of interconnection lines included in each path may be estimated in Step ST111. In such an embodiment, however, a new threshold value should be defined for the maximum wire length.

Modified Example of Embodiment 5

Next, a modified example of the fifth embodiment will be described with reference to FIG. 22.

Figure 22:
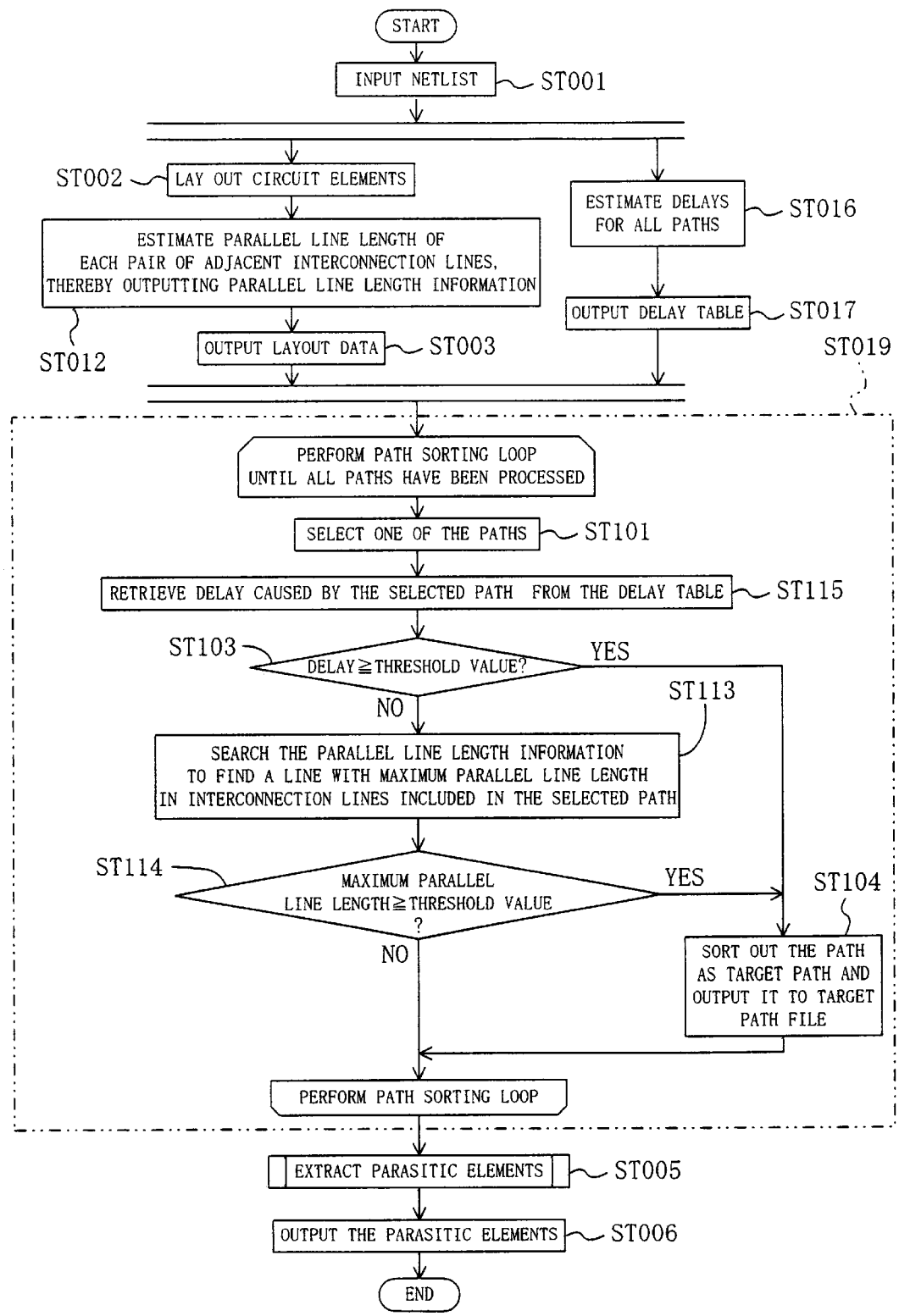
FIG. 22 illustrates a flowchart showing respective process steps for extracting parasitic elements in a method for designing a semiconductor integrated circuit according to a modified example of the fifth embodiment.

FIG. 22 illustrates the flow of a process for extracting parasitic elements in a method for designing a semiconductor integrated circuit according to the modified example of the fifth embodiment. In this modified example, after the delay that will be caused by the path selected is compared to the threshold value in Step ST103, an interconnection line with a maximum wire length is not sorted out from the path to extract the parasitic elements unlike the fifth embodiment. Instead, as in the third embodiment, Steps ST113 and ST114 are performed based on the parallel line length of a pair of mutually adjacent interconnection lines to extract the parasitic elements as shown in FIG. 22.

Thus, according to this modified example, paths can be sorted out in view of how the mutually adjacent interconnection lines affect each other.

Embodiment 6

Next, a sixth embodiment of the present invention will be described with reference to the accompanying drawings.

Figure 23:
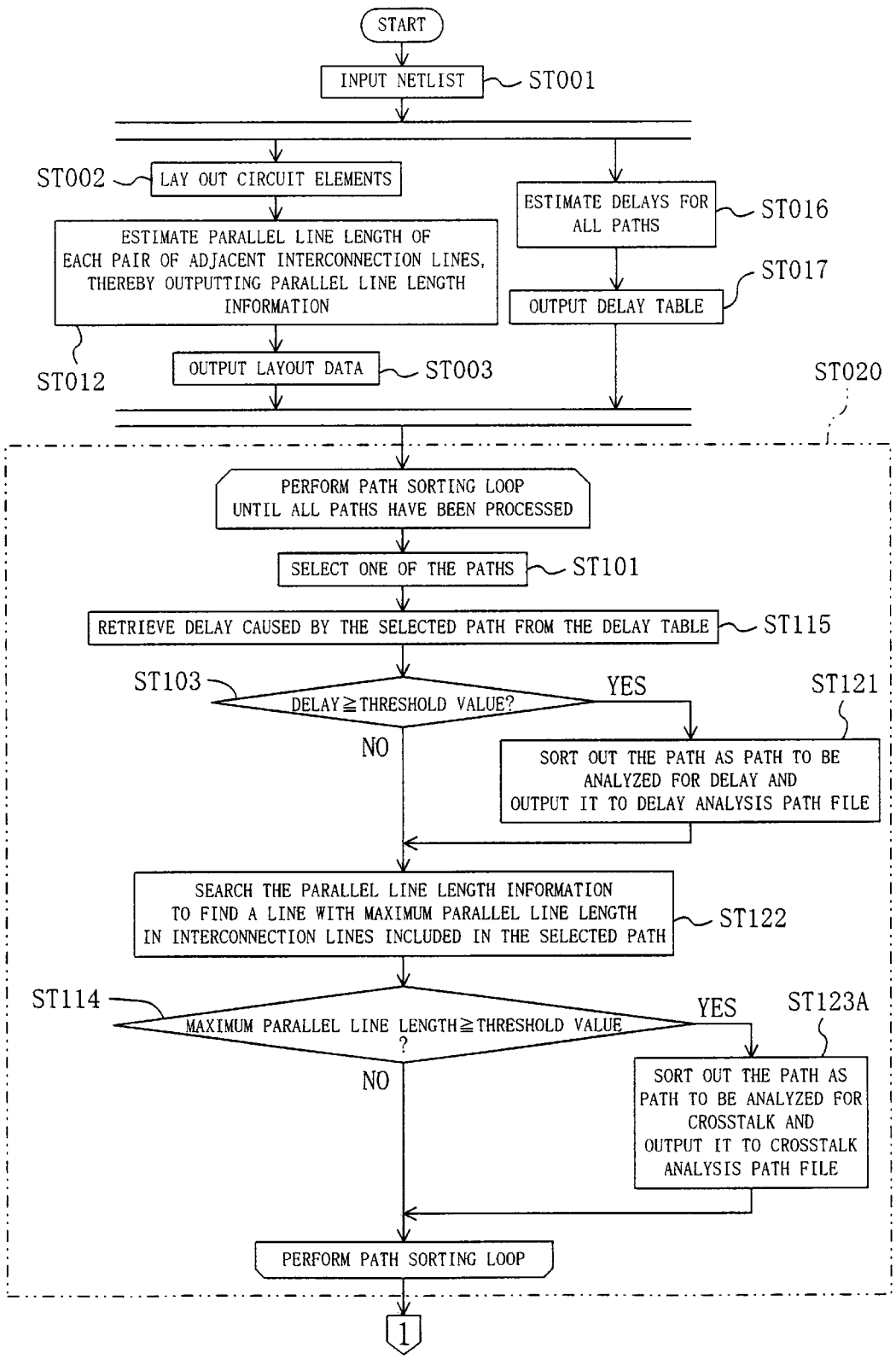
FIGS. 23 and 24 illustrate a flowchart showing respective process steps for extracting parasitic elements in a method for designing a semiconductor integrated circuit according to a sixth embodiment of the present invention.
Figure 24:
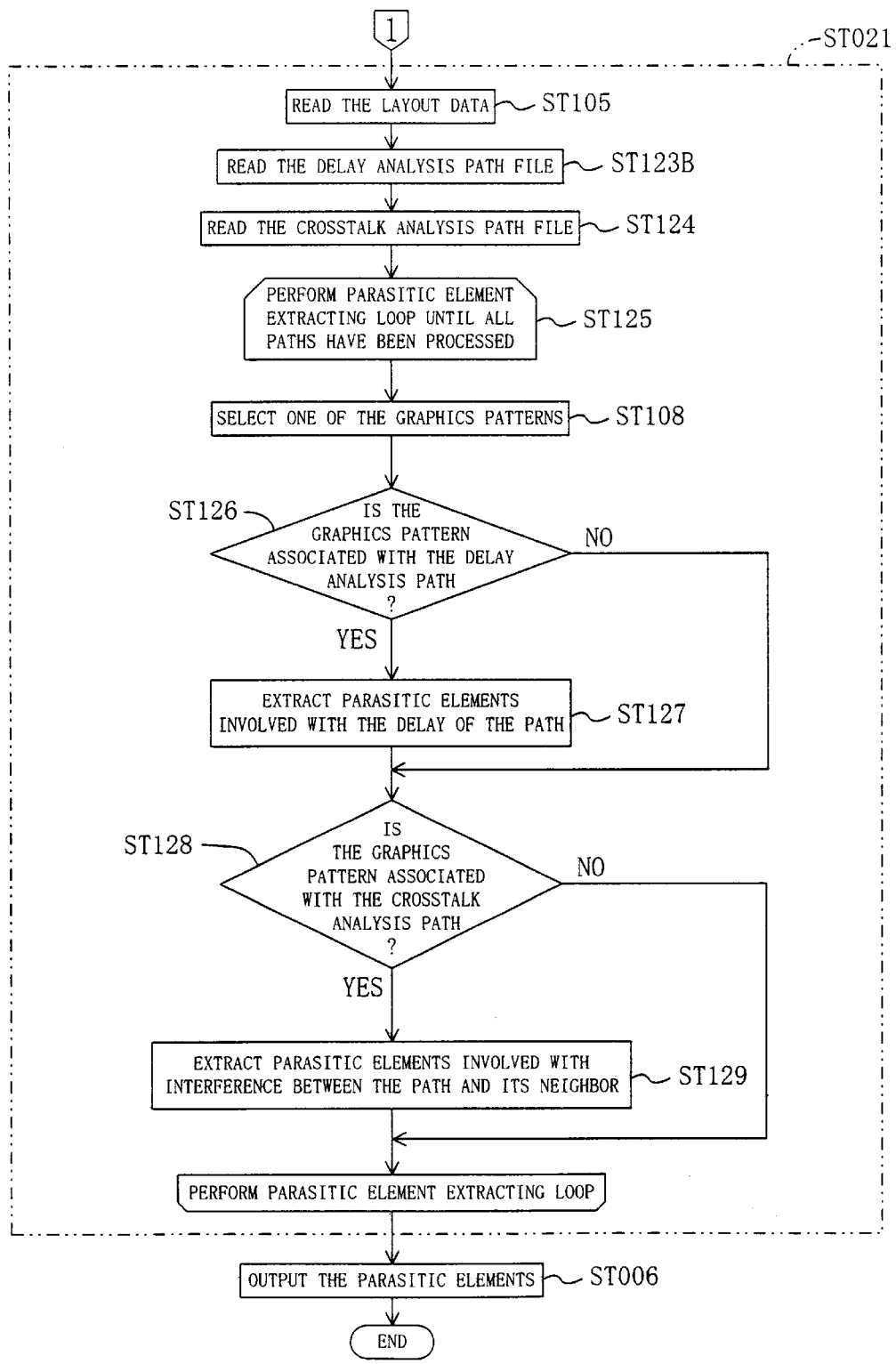

FIGS. 23 and 24 illustrate the flow of a process for extracting parasitic elements in a method for designing a semiconductor integrated circuit according to the sixth embodiment. In FIGS. 23 and 24, the same process steps as those illustrated in FIG. 22 are identified by the same reference numerals.

In the sixth embodiment, a pair of paths to be analyzed for crosstalk noise, caused between mutually adjacent interconnection lines thereof, is also sorted out.

As shown in FIGS. 23 and 24, according to the sixth embodiment, first, the delay table and layout data are prepared using the netlist as in the fifth embodiment. Thereafter, the extracting method includes Steps ST020 and ST021 of sorting out target paths and extracting parasitic elements from the target paths sorted out, respectively.

Hereinafter, Step ST020 will be described with reference to FIG. 23.

First, in Step ST115, the delay table is searched to find a delay that will be caused by the path that has been selected in Step ST101. Next, in Step ST103, it is determined whether or not the delay is equal to or greater than the threshold value. If the answer is YES, then the path, which will cause the delay in question, is output as a path to be analyzed for delay to a delay analysis path file in Step ST121.

Next, in Step ST122, the parallel line length information output in Step ST012 is searched to find interconnection lines, which are included in the path selected and are parallel to other interconnection lines included in other paths adjacent to the path selected. And one of the interconnection lines with a maximum parallel line length is sorted out. If the maximum parallel line length is found equal to or greater is than the threshold value in Step ST114, then those paths with that parallel line length are output as paths to be analyzed for crosstalk noise to a crosstalk analysis path file in Step ST123A.

These process steps will be performed on each and every path included in the netlist.

Next, Step ST021 will be described with reference to FIG. 24.

First, in Steps ST105, ST123B and ST124, the layout data, delay analysis path file and crosstalk analysis path file are read and stored in the main memory of the system in this order. However, data items may be read in an arbitrary order.

Next, an iterative process of extracting parasitic elements, which is performed for each of the graphics patterns included in the layout data read, starts at Step ST125.

First, in Step ST126, it is determined whether or not the graphics pattern selected in Step ST108 is associated with the delay analysis path. If the answer is YES, then parasitic elements are extracted from the path in question in Step ST127.

Next, in Step ST128, it is determined whether or not the graphics pattern selected in Step ST108 is associated with one of the crosstalk analysis paths. If the answer is YES, then parasitic elements, which will cause the crosstalk noise, are extracted from the path in question and a path adjacent to the former path in Step ST129.

Hereinafter, it will be described specifically how to perform Steps ST020 and ST021 on the logic circuit shown in FIG. 2 and the layout data shown in FIG. 4.

In the illustrated embodiment, the parallel line length information shown in FIG. 13 and the delay table shown in FIG. 21 are used. The threshold value for the delay is supposed to be 2.0 ns. In that case, the contents of the delay analysis path file output in Step ST121 are as shown in FIG. 25. And supposing the threshold value for the maximum parallel line length is 20 $\mu$m, the contents of the crosstalk analysis path file output in Step ST123A are as shown in FIG. 26.

Figure 27:
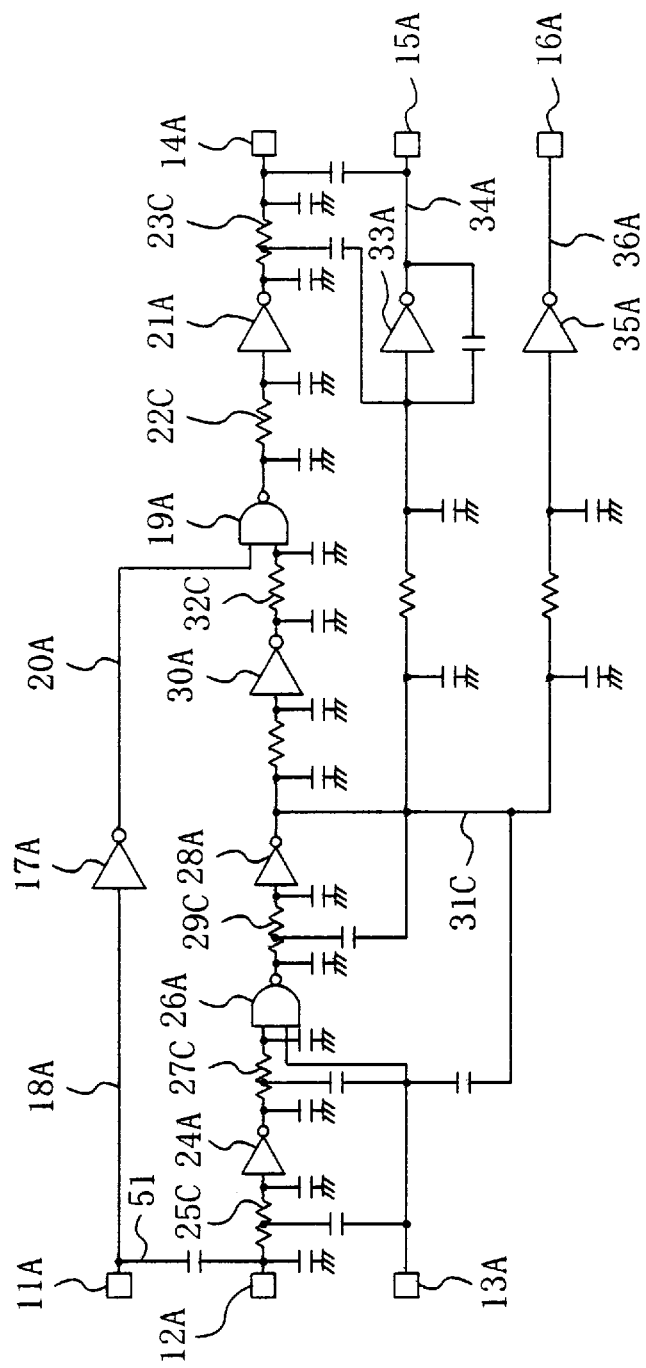
FIG. 27 illustrates a circuit diagram, in which the parasitic elements extracted from the layout data and the logic circuit shown in FIG. 2 are combined, for use in explaining how to extract parasitic elements in the method of the sixth embodiment.

Suppose Path 1 has been selected in Step ST101, for example. As shown in FIG. 3, Path 1 includes the fourth net 23A corresponding to the graphics pattern 23B representing an interconnection line. Thus, as can be seen from FIG. 13, the parallel line length defined for the graphics pattern 23B corresponding to the fourth net 23A and the graphics pattern 34B adjacent to the graphics pattern 23B is 25 $\mu$m, which is greater than the threshold value of 20 $\mu$m. Also, as shown in FIGS. 2 and 3, the graphics pattern 34B corresponds to the tenth net 34A, and the tenth net 34A is included in Paths 3 and 6. Accordingly, it is determined that signal interference is likely to be caused between Paths 1 and 3 and between Paths 1 and 6, and these three Paths 1, 3 and 6 are output to the crosstalk analysis path file. The same process steps will be performed on the other paths, i.e., the parallel line length between each pair of paths will be compared to the threshold value, paths to be analyzed will be sorted out and redundancy will be eliminated. As a result, the crosstalk analysis path file shown in FIG. 26 is obtained. FIG. 27 illustrates a circuit diagram in which parasitic elements and the logic circuit shown in FIG. 2 are combined. Those parasitic elements are added to a path that will cause a delay equal to or greater than a threshold value and/or a pair of paths including interconnection lines with a parallel line lengths equal to or greater than another threshold value and possibly causing crosstalk noise. As shown in FIG. 27, a parasitic element 25C for analyzing delay is extracted and added to the fifth net 25A included in Path 2, and a coupled capacitor 51 for analyzing crosstalk noise is extracted and added to the fifth net 25A included in Path 3 adjacent to Path 1.

In this manner, according to the sixth embodiment, a path that will cause a delay equal to or greater than a threshold value and a pair of paths including mutually adjacent interconnection lines with a parallel line length equal to or greater than another threshold value are sorted out in advance as delay and crosstalk analysis paths, respectively, from multiple paths made from the netlist. Thus, parasitic elements do not have to be extracted from all of the graphics patterns included in the layout data. Instead, those parasitic elements just need to be extracted from only the graphics patterns included in the target paths. Or a coupled capacitor, which will be caused between adjacent interconnection lines, should be extracted for a pair of paths to be analyzed for crosstalk. In this manner, target parasitic elements, causing the delay and crosstalk noise, can be sorted out beforehand. That is to say, since non-target parasitic elements are not sorted out but screened out automatically, those parasitic elements in question can be extracted in a much shorter amount of time for the delay and crosstalk analysis purposes.

Optionally, a total parallel line length of interconnection lines included in each path may be estimated in Step ST122. In such an embodiment, however, a new threshold value should be defined for the maximum parallel line length.

Embodiment 7

Next, a seventh embodiment of the present invention will be described with reference to the accompanying drawings.

Figure 28:
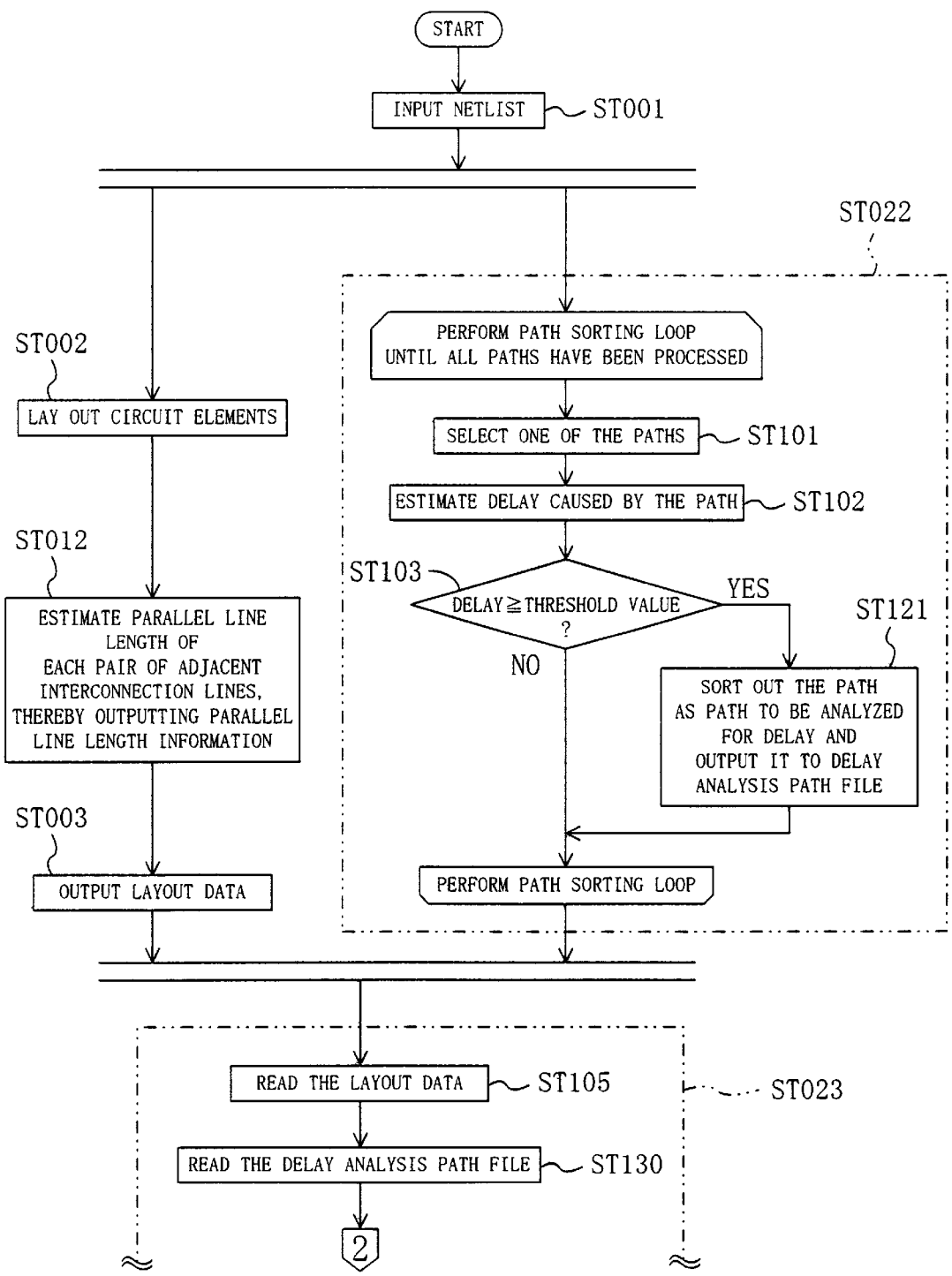
FIGS. 28 and 29 illustrate a flowchart showing respective process steps for extracting parasitic elements in a method for designing a semiconductor integrated circuit according to a seventh embodiment of the present invention.
Figure 29:
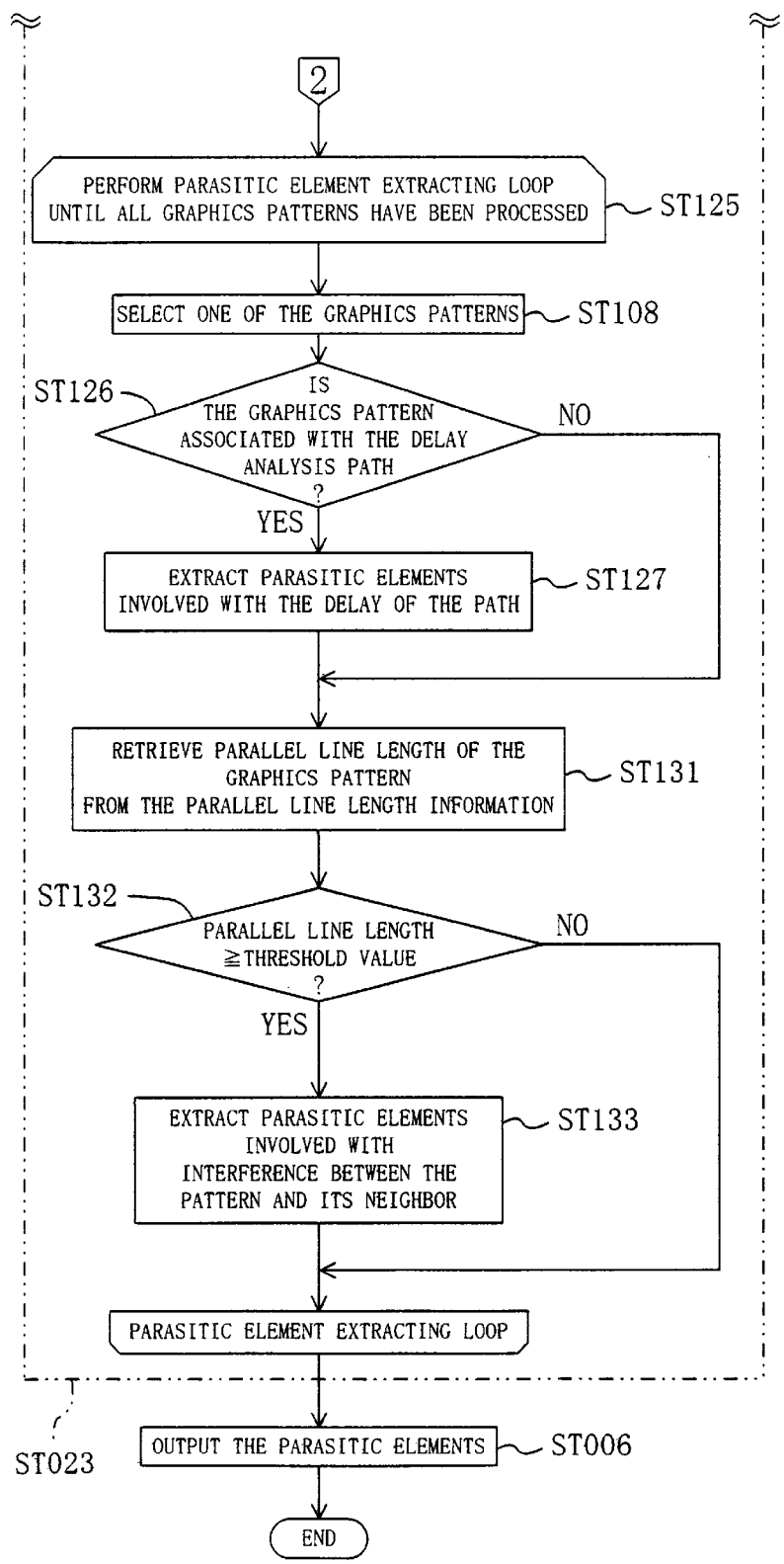

FIGS. 28 and 29 illustrate the flow of a process for extracting parasitic elements in a method for designing a semiconductor integrated circuit according to the seventh embodiment. In FIGS. 28 and 29, the same process steps as those illustrated in FIGS. 11, 23 and 24 are identified by the same reference numerals and the description thereof will be omitted herein. The seventh embodiment is different from the sixth embodiment in the following two respects. Firstly, according to the seventh embodiment, a path sorting step ST022 is performed in parallel with Steps ST012 and ST003. In Step ST022, a path, which will cause a delay equal to or greater than a predetermined threshold value, is sorted out in advance as a delay analysis path.

Secondly, in Step ST022 of the seventh embodiment, a pair of paths to be analyzed for crosstalk is not sorted out unlike Step ST020 of the sixth embodiment. Instead, according to the seventh embodiment, a parallel line length defined for a graphics pattern selected from the layout data and another graphics pattern adjacent to the former graphics pattern is compared to its threshold value in Step ST023 in accordance with the parallel line length information obtained when the layout data was made.

Hereinafter, it will be described specifically how to perform the method of this embodiment on the logic circuit shown in FIG. 2 and the layout data shown in FIG. 4. In the illustrated embodiment, the parallel line length information shown in FIG. 13 is supposed to be obtained in Step ST012 from the layout data shown in FIG. 4, for example. Also, in Step ST022, a delay analysis path file shown in FIG. 25, including Path 2, is supposed to be made from the logic circuit (netlist) shown in FIG. 2.

Next, suppose the graphics pattern 34B shown in FIG. 4 has been selected in Step ST108 included in the parasitic element extracting step ST023. In this case, the tenth net 34A, corresponding to the graphics pattern 34B selected, is not included in Path 2 as the delay analysis path. Thus, the answer to the query of Step ST126, i.e., determining whether or not the graphics pattern selected is associated with the delay analysis path, is NO, and therefore, the next step ST127 of extracting parasitic elements may be skipped.

Next, in Step ST131, the parallel line length defined for an interconnection line adjacent to the graphics pattern 34B is retrieved from the parallel line length information prepared.

The parallel line length defined for the graphics pattern 34B and its neighboring pattern 23B is 25 $\mu$m as shown on Item 0010 of the data list in FIG. 13. Supposing the threshold value for the parallel line length is 20 μm, this parallel line length of 25 μm is greater than the threshold value. Thus, the answer to the query of Step ST132 is YES. And in the next step ST133, parasitic elements, which will cause crosstalk noise due to the interference between adjacent interconnection lines, are extracted.

Figure 30:
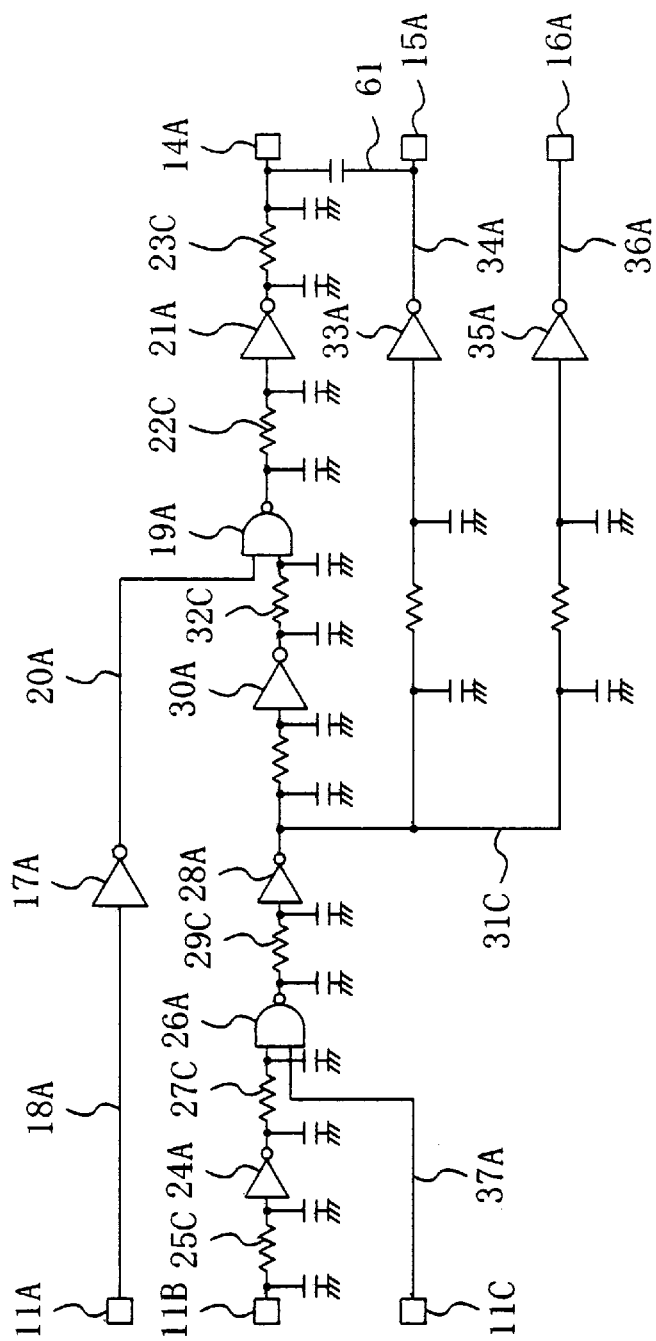
FIG. 30 illustrates a circuit diagram, in which the parasitic elements extracted from the layout data and the logic circuit shown in FIG. 2 are combined, for use in explaining how to extract parasitic elements in the method of the seventh embodiment.

FIG. 30 illustrates a circuit diagram in which parasitic elements and the logic circuit shown in FIG. 2 are combined. Those parasitic elements are added to a path that will cause a delay equal to or greater than a threshold value and/or a pair of paths including interconnection lines with a parallel line length equal to or greater than another threshold value and possibly causing crosstalk noise. As shown in FIG. 30, a parasitic element 25C for analyzing delay is extracted and added to Path 2, and a coupled capacitor 61 for analyzing crosstalk noise is extracted and added between the fourth net 23A included in Path 2 and the tenth net 34A included in Path 3 adjacent to Path 2.

In this manner, according to the seventh embodiment, the path sorting step ST022 is performed prior to the parasitic element extracting step ST023 to classify the paths into target ones and non-target ones by the delays possibly caused. In addition, in parallel with Step ST022, parallel line length information about respective interconnection lines is made in advance from the layout data. And then in Step ST023, parasitic elements are extracted for a path to be analyzed for delay and a coupled capacitor between lines is extracted for a pair of paths to be analyzed for crosstalk. Since non-target parasitic elements are not sorted out but screened out automatically, those parasitic elements in question can be extracted in a much shorter amount of time for the delay and crosstalk analysis purposes.

What is claimed is:

1. A method for designing a semiconductor integrated circuit, which includes multiple circuit elements and multiple paths interconnecting those elements together, by extracting parasitic elements, associated with at least one of the paths, from the circuit to analyze operation timing of the circuit elements, the method comprising the steps of:
   a) forming graphic patterns for the multiple circuit elements and laying out the graphic patterns according to a netlist describing topology information about interconnections among the circuit elements, thereby generating layout data including information about wire lengths;
   b) estimating wire lengths of interconnection lines included in each of the paths in accordance with the layout data, comparing said estimated wire lengths of said paths to a predetermined length, and selecting based on said comparison at least one of the paths which has an estimated wire length exceeding said predetermined length as a target path; and
   c) extracting the parasitic elements from at least one of the graphic patterns, which correspond to the target path.

2. The method of claim 1, wherein the step b) comprises the step of sorting out at least one of the paths, which is expected to cause a delay exceeding a predetermined amount of time, as a second target path.

3. The method of claim 1, wherein each path having an estimated wire length exceeding said predetermined length is identified as a target path, and parasitic elements are extracted for each target path.

4. The method of claim 1, wherein each comparison is performed utilizing the same predetermined length.

5. A method for designing a semiconductor integrated circuit, which includes multiple circuit elements and multiple paths interconnecting those elements together, by extracting parasitic elements, associated with at least one of the paths, from the circuit to analyze operation timing of the circuit elements, the method comprising the steps of:
   a) forming graphic patterns for the multiple circuit elements and laying out the graphic patterns according to a netlist describing topology information about interconnections among the circuit elements, thereby generating layout data including information about wire lengths;
   b) estimating the length of pairs of interconnection lines, which are included in two adjacent ones of the paths and are substantially parallel to each other, comparing the estimated length of said pairs of interconnection lines to a predetermined length, and selecting based on said comparison at least two of the paths, in which the estimated length of the parallel interconnection lines exceeds said predetermined length, as target paths; and
   c) extracting the parasitic elements from at least one of the graphic patterns, which correspond to the target paths.

6. The method of claim 5, wherein the step b) comprises the step of sorting out at least one of the paths, which is expected to cause a delay exceeding a predetermined amount of time, as another target path.

7. A method for designing a semiconductor integrated circuit, which includes multiple circuit elements and multiple paths interconnecting those elements together, by extracting parasitic elements, associated with at least one of the paths, from the circuit to analyze operation timing of the circuit elements, the method comprising the steps of:
   a) estimating delays, which will be caused by the respective paths, according to a netlist describing topology information about interconnections among the circuit elements;
   b) forming graphic patterns for the multiple circuit elements and laying out the graphic patterns according to the netlist, thereby generating layout data;
   c) selecting at least one of the paths, of which the estimated delay exceeds a predetermined amount of time based on a comparison between said estimated delay and said predetermined amount of time, as a first target path, each said comparison is performed utilizing the same predetermined amount of time; or
   c') estimating wire lengths of interconnection lines included in each of the paths in accordance with the layout data, comparing said estimated wire lengths of said paths to a predetermined length, and selecting based on said comparison at least one of the paths which has an estimated wire length exceeding said predetermined length, as a second target path; and
   d) extracting the parasitic elements from at least one of the graphic patterns, which correspond to the first or second target path.

8. A method for designing a semiconductor integrated circuit, which includes multiple circuit elements and multiple paths interconnecting those elements together, by extracting parasitic elements, associated with at least one of the paths, from the circuit to analyze operation timing of the circuit elements, the method comprising the steps of:
   a) estimating delays, which will be caused by the respective paths, according to a netlist describing topology information about interconnections among the circuit elements;
   b) forming graphic patterns for the multiple circuit elements and laying out the graphic patterns according to the netlist, thereby generating layout data;

c) selecting at least one of the paths, of which the estimated delay exceeds a predetermined amount of time based on a comparison between said estimated delay and said predetermined amount of time, as a first target path, each said comparison is performed utilizing the same predetermined amount of time; or c') estimating the length of pairs of interconnection lines, which are included in two adjacent ones of the paths and are substantially parallel to each other, comparing the estimated length of said pairs of interconnection lines to a predetermined length, and selecting based on said comparison at least two of the paths, in which the estimated length of the parallel interconnection lines exceeds said predetermined length, as target paths; and d) extracting the parasitic elements from at least one of the graphic patterns, which correspond to the first target path or the second target paths.

9. The method of claim 8, wherein the step c') comprises the step of sorting out the least two paths, in which the estimated length of the parallel interconnection lines exceeds the predetermined length, as paths to be analyzed for crosstalk, and wherein step d) comprises the step of extracting the parasitic elements from the graphic patterns corresponding to the paths to be analyzed for crosstalk.

* * * * *